(12) United States Patent
Onozawa

(10) Patent No.: US 9,099,522 B2
(45) Date of Patent: Aug. 4, 2015

(54) SEMICONDUCTOR DEVICE

(75) Inventor: Yuichi Onozawa, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 86 days.

(21) Appl. No.: 13/583,305

(22) PCT Filed: Feb. 18, 2011

(86) PCT No.: PCT/JP2011/053549
§ 371 (c)(1),
(2), (4) Date: Sep. 7, 2012

(87) PCT Pub. No.: WO2011/111500
PCT Pub. Date: Sep. 15, 2011

(65) Prior Publication Data
US 2013/0037853 A1 Feb. 14, 2013

(30) Foreign Application Priority Data
Mar. 9, 2010 (JP) ................. 2010-051636

(51) Int. Cl.
*H01L 29/739* (2006.01)
*H01L 29/06* (2006.01)
(Continued)

(52) U.S. Cl.
CPC ........ *H01L 29/7397* (2013.01); *H01L 29/0661* (2013.01); *H01L 29/0696* (2013.01); *H01L 29/0839* (2013.01); *H01L 29/41766* (2013.01)

(58) Field of Classification Search
CPC .............. H01L 29/739; H01L 29/7393; H01L 29/7394; H01L 29/7395; H01L 29/7396; H01L 29/7397; H01L 29/0847; H01L 29/0843; H01L 29/0839; H01L 29/0696; H01L 29/41766; H01L 29/0661
USPC .......... 257/597, 139, 330, 331, 332, 333, 334
See application file for complete search history.

(56) References Cited

U.S. PATENT DOCUMENTS

| | | |
|---|---|---|
| 5,329,142 A | 7/1994 | Kitagawa et al. |
| 5,448,083 A | 9/1995 | Kitagawa et al. |

(Continued)

FOREIGN PATENT DOCUMENTS

| | | |
|---|---|---|
| JP | 05-243561 A | 9/1993 |
| JP | 2001-308327 A | 11/2001 |

(Continued)

OTHER PUBLICATIONS

International Search Report issued in PCT/JP2011/053549, dated Apr. 26, 2011.

(Continued)

*Primary Examiner* — Eva Y Montalvo
*Assistant Examiner* — Samuel Lair
(74) *Attorney, Agent, or Firm* — Rossi, Kimms & McDowell LLP

(57) ABSTRACT

A semiconductor device includes a stripe-shaped gate trench formed in one major surface of n-type drift layer, a gate trench including gate polysilicon formed therein, and a gate polysilicon connected to a gate electrode. A p-type base layer is formed selectively in mesa region between adjacent gate trenches and a p-type base layer including an n-type emitter layer and connected to emitter electrode. One or more dummy trenches are formed between p-type base layers adjoining to each other in the extending direction of gate trenches. An electrically conductive dummy polysilicon is formed on an inner side wall of dummy trench with a gate oxide film interposed between the dummy polysilicon and dummy trench. The dummy polysilicon is spaced apart from the gate polysilicon and may be connected to the emitter electrode.

20 Claims, 33 Drawing Sheets

(51) Int. Cl.
 *H01L 29/08* (2006.01)
 *H01L 29/417* (2006.01)

(56) References Cited

U.S. PATENT DOCUMENTS

| | | | | |
|---|---|---|---|---|
| 6,815,767 | B2* | 11/2004 | Nakamura et al. | 257/330 |
| 6,815,769 | B2* | 11/2004 | Pfirsch et al. | 257/341 |
| 6,867,437 | B2* | 3/2005 | Takahashi et al. | 257/136 |
| 7,633,122 | B2* | 12/2009 | Otsuki | 257/331 |
| 8,008,711 | B2* | 8/2011 | Takahashi | 257/327 |
| 8,097,901 | B2* | 1/2012 | Koyama et al. | 257/139 |
| 2001/0054738 | A1 | 12/2001 | Momota et al. | |
| 2002/0179976 | A1 | 12/2002 | Takahashi | |
| 2005/0156231 | A1 | 7/2005 | Okuno et al. | |
| 2006/0163649 | A1 | 7/2006 | Otsuki | |
| 2007/0040215 | A1 | 2/2007 | Ma et al. | |
| 2007/0278566 | A1* | 12/2007 | Ogura et al. | 257/330 |
| 2008/0315249 | A1 | 12/2008 | Minato et al. | |
| 2008/0315250 | A1 | 12/2008 | Onozawa | |
| 2009/0283797 | A1 | 11/2009 | Takahashi et al. | |
| 2011/0233684 | A1* | 9/2011 | Matsushita | 257/378 |
| 2011/0297934 | A1* | 12/2011 | Soeno | 257/48 |
| 2012/0267680 | A1* | 10/2012 | Oya et al. | 257/139 |
| 2013/0328105 | A1* | 12/2013 | Matsuura | 257/139 |

FOREIGN PATENT DOCUMENTS

| | | |
|---|---|---|
| JP | 2003-197912 A | 7/2003 |
| JP | 2005-203550 A | 7/2005 |
| JP | 2006-210547 A | 8/2006 |
| JP | 2006-245477 A | 9/2006 |
| JP | 2008-288349 A | 11/2008 |
| JP | 2009-277792 A | 11/2009 |

OTHER PUBLICATIONS

Extended European Search Report issued in European Patent Application No. 11 75 3162 dated Nov. 27, 2014.

* cited by examiner

SEMICONDUCTOR DEVICE

FIELD OF THE INVENTION

The present invention relates to semiconductor devices.

BACKGROUND

It has been expected eagerly to reduce the electric power consumption in the power semiconductor devices which play a central role in the various uses of electric power converters such as the use for industries and the use for electric vehicles. Among the power semiconductor devices, the use of insulated-gate bipolar transistors (hereinafter referred to as "IGBTs") has been established firmly, since the IGBTs facilitate obtaining a low ON-voltage by virtue of the conductivity modulation effects thereof and since the IGBTs are controlled easily via the gates thereof driven by a voltage. Especially, the trench-gate IGBT including a gate electrode in a trench formed in a silicon wafer surface facilitates reducing the ON-voltage, since the trench-gate IGBT facilitates increasing the density (total length) of inversion layers (channels).

In the trench-gate IGBTs, the tradeoff performance between the turnoff loss and the ON-voltage is closing to the theoretical limit by the combination of a well-known field-stop structure for stopping a depletion layer and a thinned n-type drift layer. Therefore, it is difficult to further improve the performances of the trench-gate IGBTs dramatically.

However, the power semiconductor devices, made of a compound semiconductor such as silicon carbide (SiC) and gallium nitride (GaN) and expected to be the devices of the next generation, are still on the way of development. Therefore, the mass-production of compound semiconductor IGBTs enough to replace the silicon IGBTs completely has not been realized yet. Since it is unrealistic at present to think that the silicon IGBTs vanish from the market, it is necessary to further improve the performances of the IGBTs.

As a representative IGBT of late, the IGBT, the structure of which is described in the following Patent Document 1, is well known to the persons skilled in the art. FIG. 31 is the cross sectional view of a conventional semiconductor device. In FIG. 31, the structure described in the Patent Document 1 is shown. In the IGBT shown in FIG. 31, gate trench 7 and dummy trench 8 are arranged in the device front surface such that gate trench 7 and dummy trench 8 are parallel to each other. The planar layout of gate trench 7 and dummy trench 8 is shaped with a stripe pattern. In other words, gate trench 7 and dummy trench 8 are formed in a stripe pattern in perpendicular to the plane of paper in FIG. 31.

Layers of a p-type including p-type base layer 4 are formed uniformly in the surface portion on the front surface side of the device. The p-type layer in mesa region 18 is insulated from p-type base layer 4 by gate trench 7. In other words, the p-type layer in mesa region 18 is floating p-type layer 30 having a floating potential. Floating p-type layer 30 is insulated from emitter electrode 12 by interlayer insulator film 9.

Gate trench 7 is filled with gate polysilicon 11a that works as a control electrode made of polycrystalline silicon (polysilicon). Dummy trench 8 is filled with electrically-conductive dummy polysilicon 11b with gate oxide film 10 interposed between dummy trench 8 and dummy polysilicon 11b. Dummy polysilicon 11b is connected to emitter electrode 12. In the ON-state of the gate electrode, the holes injected from p-type collector layer 3 on the back surface of the device to n-type drift layer 1 flow to emitter electrode 12 through p-type base layer 4.

By covering a large part of the front side surface of the device by floating p-type layer 30 as described above to reduce the p-type base layer 4 area in the device front surface, the holes injected into n-type drift layer 1 are accumulated in the lower part of p-type base layer 4. As a result, the ON-voltage becomes small dramatically. This effect is called an "injection enhancement (IE) effect". By connecting electrically-conductive dummy polysilicon 11b loaded in dummy trench 8 to emitter electrode 12, it becomes possible to reduce the Miller capacitance.

As the other representative IGBT, the IGBT, the structure of which is described in the following Patent Document 2, is well known to the persons skilled in the art. FIG. 32 is the cross sectional view of the other conventional semiconductor device. In FIG. 32, the oblique view of the IGBT structure described in the Patent Document 2 is shown. In the IGBT shown in FIG. 32, gate trenches 7 are formed in the front surface of a silicon wafer including n-type drift layer 1. Between adjacent gate trenches 7, p-type base layer 4 doped more heavily than n-type drift layer 1 is formed selectively.

In the surface portion on the front surface side of p-type base layer 4, n-type emitter layer 5 and a not-shown p-type contact layer are formed selectively. In the extending direction of gate trench 7, p-type base layer 4 and n-type drift layer 1 are formed such that p-type base layer 4 and n-type drift layer 1 appear one by one in mesa region 18 and such that p-type base layers 4 are arranged scatteredly. In the direction perpendicular to the extending direction of gate trench 7, n-type drift layer 1 and p-type base layer 4 are arranged alternately with gate trench 7 interposed between n-type drift layer 1 and p-type base layer 4. In the entire active region, p-type base layers 4 are arranged in a checkered planar layout.

Since p-type base layers 4 are scattered and arranged uniformly by arranging p-type base layers 4 in a checkered planar layout, the electric field distribution in the silicon wafer becomes uniform. As a result, the breakdown voltage of the device is prevented from lowering. In gate trench 7, gate polysilicon 11a for a control electrode made of polysilicon is loaded with gate oxide film 10 interposed between gate trench 7 and gate polysilicon 11a. A not-shown interlayer insulator film is formed such that the interlayer insulator film covers the portions of the device, to which gate polysilicon 11a and the front surface of n-type drift layer 1 are exposed.

On the interlayer insulator film, a not-shown emitter electrode is formed such that the emitter electrode is in contact commonly with n-type emitter layer 5 and p-type base layer 4. Contact opening 14, through which n-type emitter layer 5 and p-type base layer 4 are in contact with the emitter electrode, is formed on n-type emitter layer 5 and p-type base layer 4. On the surface opposite to the front surface of the n-type drift layer 1 (on the back surface), n-type field-stop layer 2 and p-type collector layer 3 are formed. On the p-type collector layer 3 surface (wafer back surface), a not shown collector electrode is formed.

The conventional IGBT shown in FIG. 32 is featured by the specific configuration for avoiding the problem caused by the floating structure described later. In detail, mesa region 18 and p-type base layer 4 are made to adjoin each other so that the potential of mesa region 18 sandwiched by gate trenches 7 may not float but may follow the p-type base layer 4 potential. The specific configuration secures the gate controllability that suppresses easily, by the gate resistance, the rapid increase of the current increasing rate caused by the floating structure in the turn-on of the IGBT.

However, if the floating region is eliminated from the IGBT simply, the IGBT returns to an ordinary trench-gate one and the carrier injection enhancement effect (IE effect) is lost. As a result, the ON-voltage rises. So as not to loose the IE effects, mesa region 18 sandwiched by gate trenches 7 is divided into p-type base layers 4 and the emitter electrode is brought into contact only with divided type base layers 4. The configuration described above facilitates keeping the ON-voltage of the trench-gate IGBT at a low value and reducing the switching loss. By the configuration, the total electrical loss caused in the practical apparatuses such as an inverter is reduced. Since the region, in which the gate electrode is facing to n-type emitter layer 5, is reduced, the capacitance between the gate and emitter is reduced.

Further, by appropriately arranging the trench-gate structure, in which the spacing between the trenches is narrow to some extents, the electric field localization to the trench-gate bottom is relaxed and a high breakdown voltage is obtained. In detail, by narrowing the mesa region 18 width sandwiched by gate trenches 7, the portion of n-type drift layer 1 in mesa region 18 between gate trenches 7 is made to be depleted easily by an applied voltage of several V. By the configuration described above, the electric field distribution in the vicinity of the device front surface is made to be uniform in the OFF-state of the device and, especially, the capacitance between the gate and collector (Miller capacitance) is reduced.

DOCUMENTS DESCRIBING THE PRIOR ARTS

Patent Documents

[Patent Document 1] Japanese Unexamined Patent Application Publication No. 2006-245477
[Patent Document 2] Japanese Unexamined Patent Application Publication No. 2006-210547

SUMMARY OF THE INVENTION

Problems to be Solved by the Invention

The increase of the Miller capacitance (capacitance between the gate and collector) impairs the switching performances of the IGBTs. Especially when the voltage between the collector and emitter (collector-emitter voltage) is low or when a depletion layer starts expanding from the state, in which carriers are accumulated in the vicinity of a gate oxide film, in the turning-off that shifts an IGBT to the OFF-state thereof, the depletion layer edge area between the gate and collector becomes the largest. Since the depletion layer width is extremely small at this time, the Miller capacitance becomes large and the switching performances (turnoff time, turnoff loss, etc.) are impaired. These phenomena are caused in the same manner also immediately before the depletion layer vanishes in the turn-on that shifts the IGBT to the ON-state thereof.

The Miller capacitance increase described above affects especially in the turnoff that shifts the IGBT from the ON-state to the OFF-state. When the IGBT is conductive before the turnoff, a voltage as high as the saturation voltage is applied between the collector and emitter and many carriers are accumulated in the vicinity of the gate oxide film. Therefore, the Miller capacitance is nothing but the capacitance of the gate oxide film. As soon as the turnoff starts, depletion starts from the vicinity of a pn-junction. Immediately after a depletion layer starts expanding, the area of the depletion layer edge is large and the depletion layer width is extremely small. Remaining carriers prevent the depletion layer from expanding. Therefore, the Miller capacitance is the largest in the turnoff that shifts the IGBT from the ON-state to the OFF-state. Due to the largest Miller capacitance, the turnoff time increases and the collector-emitter voltage rises slowly. Therefore, the switching loss increases.

The Miller capacitance increases also in the turn-on that shifts the IGBT from the OFF-state to the ON-state. In the blocking state before the turn-on, a sufficiently high voltage is applied between the collector and emitter and the carries are not below the gate oxide film. Therefore, the Miller capacitance is sufficiently small. However, as soon as the turn-on starts, the depletion layer width is reduced and carriers are injected. Especially, as the collector-emitter voltage becomes small sufficiently, the area of the depletion layer edge increases and the depletion layer width becomes small. Therefore, the Miller capacitance increases. As a result, the fall (starting point of the decrease) of the collector-emitter voltage delays a little bit and switching loss increase is caused.

For reducing the switching loss, it is necessary also for the IGBT shown in FIG. 31 and including floating p-type layer 30 in a wide range to reduce the Miller capacitance. For reducing the Miller capacitance in the IGBT shown in FIG. 31, dummy polysilicon 11b loaded in dummy trench 8 is connected to emitter electrode 12 to fix the dummy polysilicon 11b potential at the emitter electrode 12 potential. By fixing the dummy polysilicon 11b potential at the emitter electrode 12 potential, the floating p-type layer 30 potential is close to the emitter electrode 12 potential and the Miller capacitance is reduced to some extents.

However, it is known that the problems described below are caused in the turn-on process of the IGBT, shown in FIG. 31 and combining floating p-type layer 30 and dummy trench 8. When the mesa region 18 potential is floating, the gate electrode 15 potential increases or varies rapidly on the way of turn-on and the turn-on di/dt (current increasing rate in the turn-on) increases rapidly. When the IGBT turns on, the depletion layers expanding in n-type drift layer 1 in the OFF-state of the IGBT shrink and distribute only in the device front surface. In the case, the holes injected from p-type collector layer 3 on the device bask surface to n-type drift layer 1 flow to p-type base layer 4 and flow also into floating p-type layer 30 that occupies a large part of the device front surface. At this time, the hole concentration increases in the depletion layer still remaining. As a result, the electric field intensity increases and the floating p-type layer 30 potential rises.

The potential rise in floating p-type layer 30 described above makes the potential of gate polysilicon 11a loaded in gate trench 7 adjacent to floating p-type layer 30 also rise. Due to the potential rise of gate polysilicon 11a, a displacement current is caused in a gate driver circuit via gate polysilicon 11a. Due to the displacement current, the gate electrode 15 potential increases rapidly. In response to the rapid increase of the gate electrode 15 potential, the collector current increases rapidly. As a result, the turn-on di/dt increases rapidly. The potential rise of floating p-type layer 30 is caused in a minute period of time, several tens ns or shorter, and is dependent on the behaviors of the depletion layers and holes in the IGBT. The displacement current that flows to the gate driver circuit via gate polysilicon 11a. is also large. If the gate resistance arranged between the gate driver circuit and gate electrode 15 is set to be large, it will be impossible to reduce the turn-on di/dt and strong electromagnetic noises are caused in the operations of a practical apparatus such as an inverter, affecting unfavorably.

The unfavorable phenomena are caused more remarkably by connecting dummy polysilicon 11b loaded in dummy trench 8 to emitter electrode 12. In detail, the holes injected into n-type drift layer 1 from p-type collector layer 3 in the turn-on process localize to the portion of mesa region 18 formed between dummy trench 8 and gate trench 7 rather than to the vicinity of floating p-type layer 30 fixed almost at the emitter potential. As a result, the potential of the mesa region 18 portion formed between dummy trench 8 and gate trench 7 is increased further greatly and sharply and it becomes very difficult to control the turn-on di/dt by the gate resistance.

To prevent the turn-on di/dt from increasing rapidly and to control the turn-on di/dt by the gate resistance, there is no way but to fix the potential of mesa region 18 between dummy trench 8 and gate trench 7. For fixing the potential of mesa region 18 between dummy trench 8 and gate trench 7, it is necessary to connect mesa region 18 between dummy trench 8 and gate trench 7 to emitter electrode 12. However, the connection causes the other large reaction. In detail, when mesa region 18 between dummy trench 8 and gate trench 7 is connected to emitter electrode 12, the IE effect is reduced remarkably, since the holes injected from p-type collector layer 3 to n-type drift layer 1 are extracted to the emitter from the connection portion of mesa region 18 and emitter electrode 12. As a result, the controllability of the turn-on di/dt by the gate resistance recovers but the ON-voltage increases inevitably in compensation for the controllability recovery.

Therefore, it is difficult for the conventional trench IGBT including floating p-type layer 30 to make (1) the formation of dummy trench 8 for reducing the Miller capacitance and (2) the connection of mesa region 18 between gate trench 7 and dummy trench 8 to emitter electrode 12 without bringing mesa region 18 into the complete floating state compatible with each other in the use thereof in a practical apparatus such as an inverter.

The semiconductor device having the IGBT structure shown in FIG. 32 makes the problem of rapid turn-on di/dt increase in a short period and the IE effect compatible with each other. The IGBT shown in FIG. 32 intensifies the IE effects as described above, sets the ON-voltage to be low, and improves the controllability of the turn-on di/dt remarkably by adjusting the gate resistance and such a parameter.

However, in the conventional IGBT shown in FIG. 32, the Miller capacitance (capacitance between the gate and collector) is not small enough and the switching performance thereof are impaired.

In view of the foregoing, it is a first object of the invention to provide a semiconductor device, the Miller capacitance thereof is small, for obviating the problems of the prior art. It is a second object of the invention to provide a semiconductor device, the ON-voltage thereof is low. It is a third object of the invention to provide a semiconductor device, the switching loss thereof is low.

Means for Solving the Problems

According to an aspect of the invention, there is provided a semiconductor device including:

a first semiconductor layer of a first conductivity type;

a second semiconductor layer of a second conductivity type formed above the first semiconductor layer;

a first trench formed in the surface of the second semiconductor layer, the first trench being shaped with a stripe;

a gate electrode formed in the first trench with an insulator film interposed between the gate electrode and the first trench;

a third semiconductor layer of the first conductivity type formed selectively between the first trenches in the extending direction of the first trenches;

a fourth semiconductor layer of the second conductivity type formed selectively in the surface of the third semiconductor layer;

an emitter electrode in contact with the third semiconductor layer and the fourth semiconductor layer;

a collector electrode in contact with the first semiconductor layer;

and a second trench formed between the first trenches adjacent to each other, the second trench being formed in parallel to the first trenches adjacent to each other, and the second trench being formed between two of the third semiconductor layers.

The specific feature of the semiconductor device structure according to the invention is that one or more dummy trenches (second trenches) are formed between p-type base layers (third semiconductor layers) formed selectively in a mesa region between two adjacent stripe-shaped gate trenches (first trenches). By the specific structure according to the invention, the Miller capacitance is reduced.

Advantageously, the semiconductor device further includes a first electrical conductor buried in the second trench with an insulator film interposed between the first electrical conductor and the second trench, and the first electrical conductor is spaced apart from the gate electrode. Here, "spaced apart" implies "electrically insulated".

According to the invention, a depletion layer expands from the side wall of the dummy trench in same manner as from the gate trench. Therefore, the depletion layers expanding from the side walls of the gate trench and dummy trench contact with each other at a small applied voltage, reducing the Miller capacitance.

Advantageously, the first electrical conductor is connected to the emitter electrode.

According to the invention, the depletion layers are pinched off at a low applied voltage and the first electrical conductor is set always at the same potential with that of the emitter electrode. Therefore, the Miller capacitance is further reduced.

Advantageously, the first electrical conductor is connected to the emitter electrode in the distal end portion of the second trench in the extending direction of the second trench.

Advantageously, two or more of the second trenches are formed between the first trenches adjacent to each other.

According to the invention, the distance between the first and second trenches or the distance between the adjacent two second trenches is shortened and the mesa region is depleted by a smaller applied voltage. As a result, the Miller capacitance is further reduced.

Advantageously, the first electrical conductors formed in two or more of the second trenches are connected electrically to each other for setting the first electrical conductors at the same potential.

According to the invention, the first electrical conductors formed in a plurality of second trenches are set at the same potential and made to follow potential variations stably. As a result, the Miller capacitance is further stabilized.

Advantageously, the second trenches adjacent to each other are connected to each other in the distal end portions of the second trenches in the extending direction of the second trenches, and the first electrical conductors formed in the second trenches are connected to each other in the distal end portions.

Advantageously, the semiconductor device further includes a second electrical conductor on the upper surfaces of the second trenches adjacent to each other, the second electrical conductor being in contact with the first electrical conductors for connecting the first electrical conductors in the second trenches to each other, and the second electrical conductor is connected to the emitter electrode in a part of the second electrical conductor.

Advantageously, the first electrical conductor is separated from the emitter electrode, the collector electrode, and the gate electrode for setting the first electrical conductor at a floating potential.

According to the invention, the first electrical conductor may be at a floating potential. In this case, the second trenches and the first electrical conductors formed in the second trenches exhibit the effects the same with those described above. The mask layout and manufacturing process for forming the second trenches and the first electrical conductors therein are made to be easy.

Advantageously, the first trench and the second trench are in contact with each other on the side wall of the first trench along the extending direction of the first trench or on the side wall of the second trench along the extending direction of the second trench.

Advantageously, the distance between the first trench and the second trench is shorter than the width of a built-in depletion layer that expands, in a thermal equilibrium state, into the second semiconductor layer from the pn-junction between the second semiconductor layer and the third semiconductor layer.

By forming the second trench between the adjacent first trenches (in the mesa region) according to the invention, the depletion layers expanding from the first trenches are pinched off, even when the voltage applied between the collector and emitter is low, and the area of the equipotential surface is reduced.

By forming a plurality of the second trenches, the distance between the second and first trenches or the distance between the adjacent second trenches is shortened. As a result, the substantial width of the mesa region is narrowed and the IE effect is improved.

By reducing the Miller capacitance, the switching time or the switching loss is reduced.

Effects of the Invention

According to the invention, a semiconductor device, the Miller capacitance thereof is small, is obtained. According to the invention, a semiconductor device, the ON-voltage thereof is low is obtained. According to the invention, a semiconductor device that causes a small switching loss is obtained.

BRIEF DESCRIPTIONS OF THE DRAWINGS

MODES FOR CARRYING OUT THE INVENTION

Figure 1:
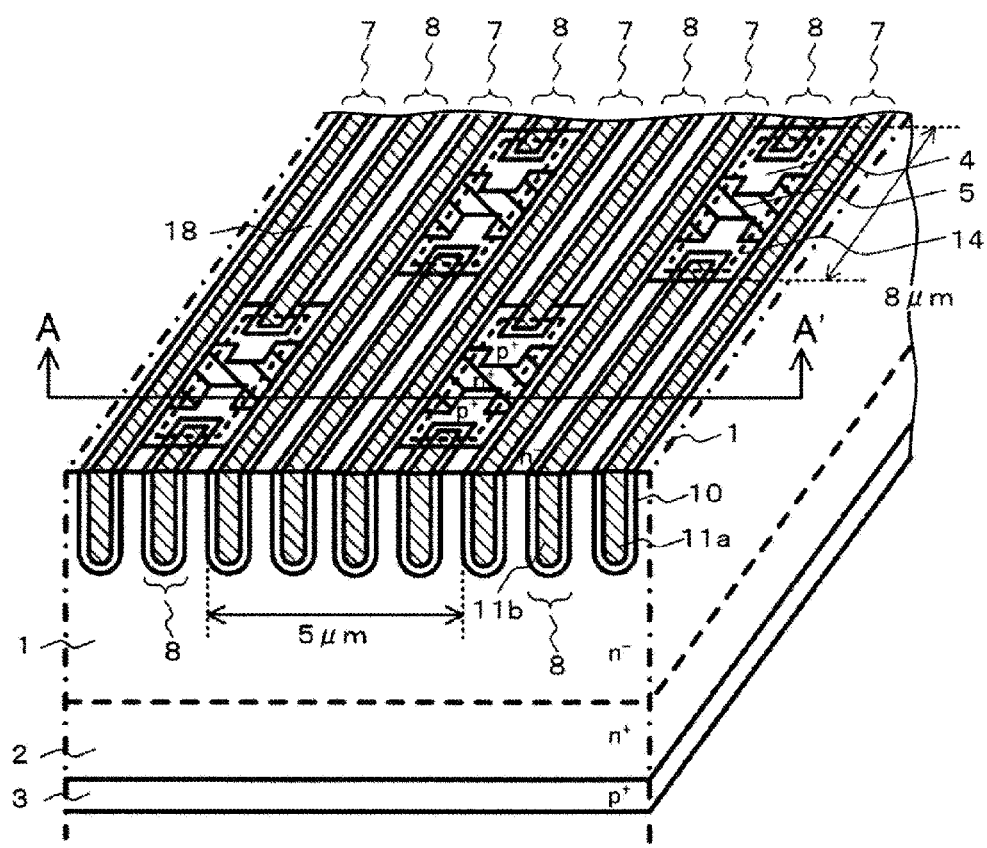
FIG. 1 is the oblique view of a semiconductor device according to a first embodiment of the invention.

Now the invention will be described in detail hereinafter with reference to the accompanied drawings which illustrate the preferred embodiments of the invention.

In the following descriptions and the accompanied drawings, the n-type layer or the n-type region is a layer or a region, therein electrons are majority carriers. The p-type layer or the p-type region is a layer or a region, therein holes are majority carriers. The suffix "+" on the shoulder of the letter "n" or "p" indicating the conductivity type of the layer or the region indicates that the layer or the region is doped relatively heavily. The suffix "−" on the shoulder of the letter "n" or "p" indicating the conductivity type of the layer or the region indicates that the layer or the region is doped relatively lightly.

In the following descriptions and the accompanied drawings, the same reference numerals are used to designate the same or similar constituent elements and their duplicated descriptions will not be made for the sake of simplicity. Although the first conductivity type is a p-type and the second conductivity type is an n-type in the following descriptions and the accompanied drawings, the semiconductor device according to the invention will work in the same manner, if the conductivity types are interchanged to each other. In the descriptions of the embodiments of the invention, a semiconductor device will be referred to sometimes as an "IGBT", a "device" or a "chip".

First Embodiment

A semiconductor device according to a first embodiment of the invention will be described below with reference to FIG. 1. FIG. 1 is the oblique view of the semiconductor device according to the first embodiment. In FIG. 1, gate trenches 7 having a stripe planar pattern are formed in one major surface (corresponding to the upper surface in the plane of paper; hereinafter referred to simply as the "upper surface") of a substrate that works as n-type drift layer 1. On the inner wall of gate trench 7, gate oxide film 10 is formed. Electrically conductive gate polysilicon 11a is formed surrounded by gate oxide film 10.

In the surface portion on the upper surface side of n-type drift layer 1, p-type base layer 4 in contact with the outer side walls of gate trenches 7 is formed selectively between adjacent gate trenches 7. In other words, p-type base layer 4 is in contact with gate oxide film 10 formed on the inner wall of gate trench 7. In the extending direction of gate trench 7, p-type base layer 4 is 1 μm or longer and 10 μm or shorter in length, although it depends on the performances of the IGBT and the design rule.

Also in the extending direction of gate trench 7, the spacing between p-type base layers 4 adjoining to each other across mesa region 18 is 10 μm or longer and 50 μm or shorter with no problem, although it depends on the performances of the IGBT and the design rule. In the direction perpendicular to the extending direction of gate trench 7, the unit length in the cyclic structure of p-type base layer 4 and gate trench 7 is 1 μm or longer and 10 μm or shorter with no problem, although it depends on the performances of the IGBT and the design rule.

In the surface portion on the upper surface side of base layer 4, n-type emitter layer 5 in contact with gate trench 7 in the same manner as p-type base layer 4 is formed. The distal end portions of n-type emitter layer 5 parallel to the extending direction of gate trench 7 are arranged such that the distal end portions may be inside p-type base layer 4. In other words, n-type emitter layer 5 is shorter than p-type base layer 4 in the extending direction of gate trench 7.

Between two adjacent gate trenches 7, n-type emitter layers 5, adjoining each other in perpendicular to the extending direction of gate trenches 7 and in contact with the adjacent gate trenches 7, may be arranged in a planar rudder pattern connecting two adjacent gate trenches 7 and connected to the upper surface of p-type base layer 4 with no problem. In detail, n-type emitter layers 5 may be shaped with a letter H in a planar layout with no problem as shown in FIG. 1.

On the upper surface of p-type base layer 4, a not-shown interlayer insulator film is formed. Opening (contact opening) 14 for making p-type base layer 4 and n-type emitter layer 5 contact with an emitter electrode is formed in the interlayer insulator film and on the inner side of p-type base layer 4. In other words, a part of p-type base layer 4 and a part of n-type emitter layer 5 are exposed to contact opening 14.

In mesa region 18 between p-type base layers 4 formed selectively between adjacent gate trenches 7, dummy trench 8 shaped with a strip is formed in parallel to the extending direction of gate trench 7. On the inner side wall of dummy trench 8, gate oxide film 10 is formed in the same manner as in gate trench 7. Electrically-conductive dummy polysilicon 11b is formed in gate oxide film 10.

Dummy trench 8 and gate trench 7 are spaced apart from each other. Therefore, dummy polysilicon 11b formed in dummy trench 8 is not connected to gate polysilicon 11a formed in gate trench 7 but spaced apart from gate polysilicon 11a. Here, "spaced apart from" implies that pertinent regions are insulated from each other electrically or that the pertinent regions are separated from each other for a certain distance.

The distal end portion of dummy trench 8 in the extending direction thereof is terminated inside p-type base layer 4. As a result, dummy polysilicon 11b is terminated also inside p-type base layer 4. In contact with the other major surface (corresponding to the lower surface in the plane of paper; hereinafter referred to simply as the "lower surface") of the substrate that will work as n-type drift layer 1, n-type field-stop layer 2 is formed. In contact with the lower surface of n-type field-stop layer 2, p-type collector layer 3 is formed. On the lower surface of p-type collector layer 3, a not-shown collector electrode is formed.

Figure 2:
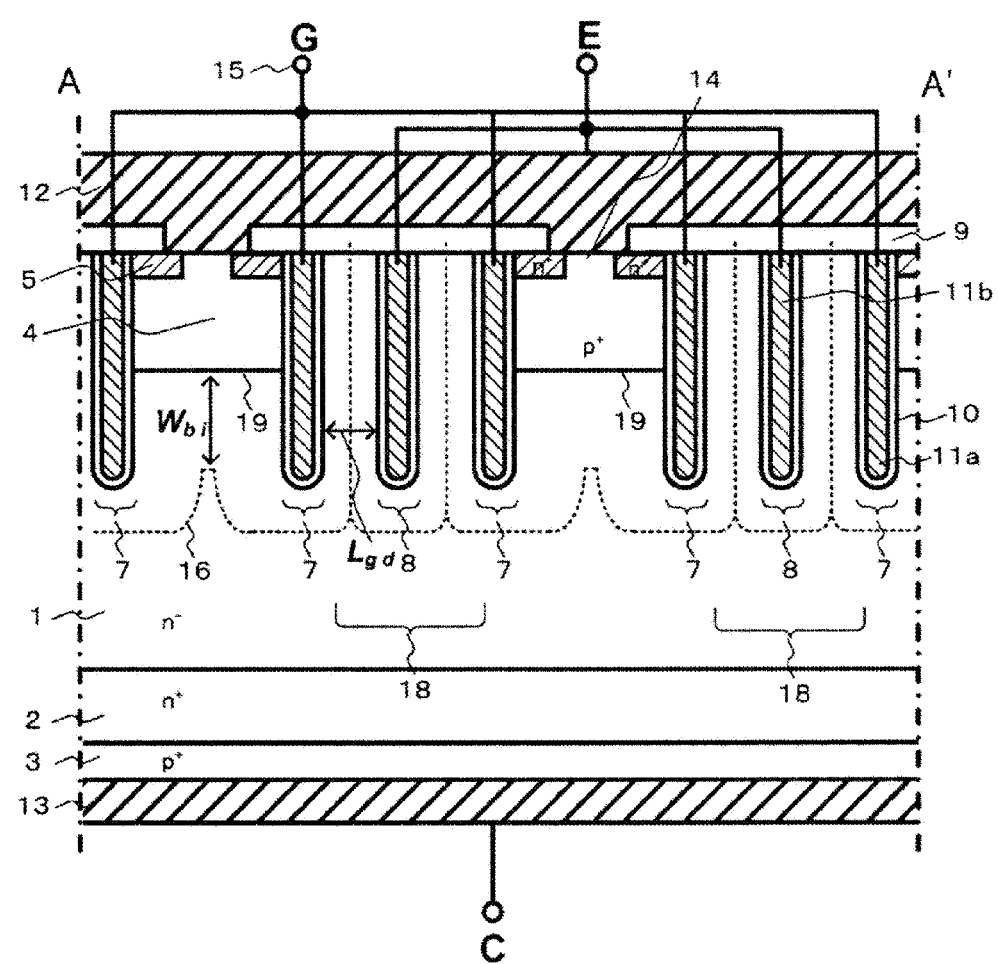
FIG. 2 is a cross sectional view along the cutting-plane line A-A' in FIG. 1.
Figure 4:
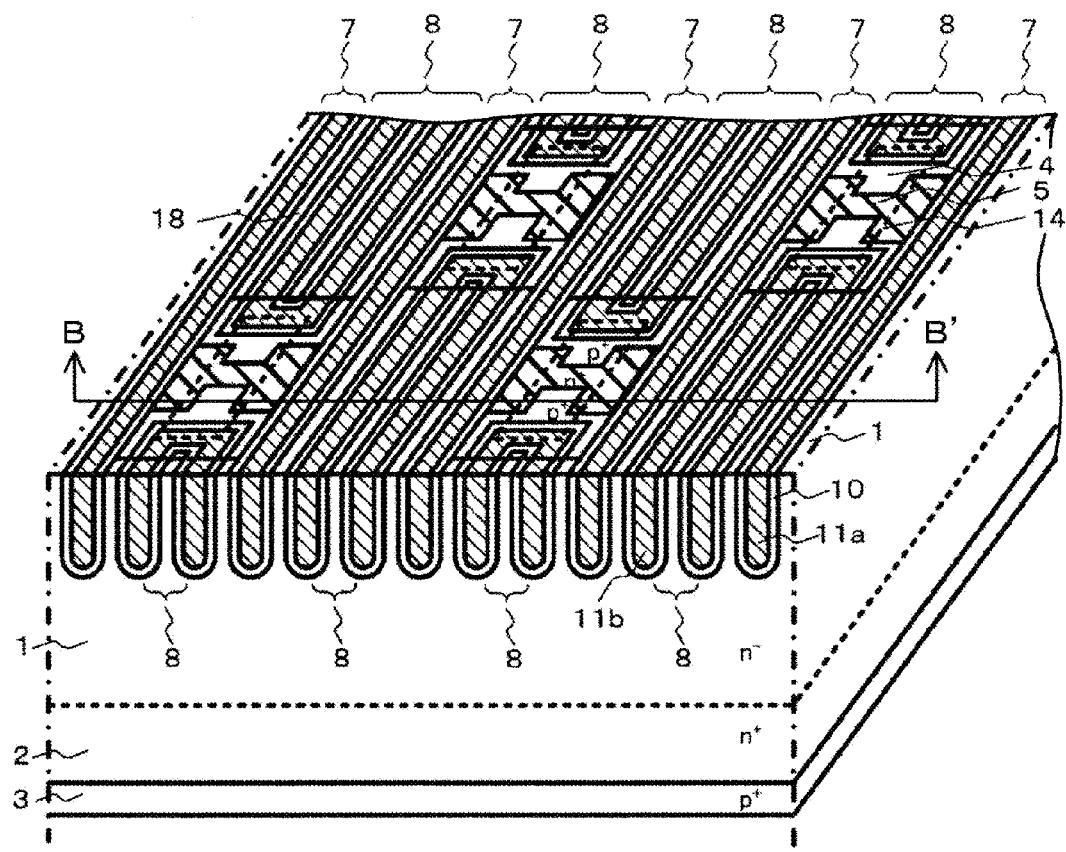
FIG. 4 is the oblique view of the semiconductor device according to a second embodiment of the invention.
Figure 23:
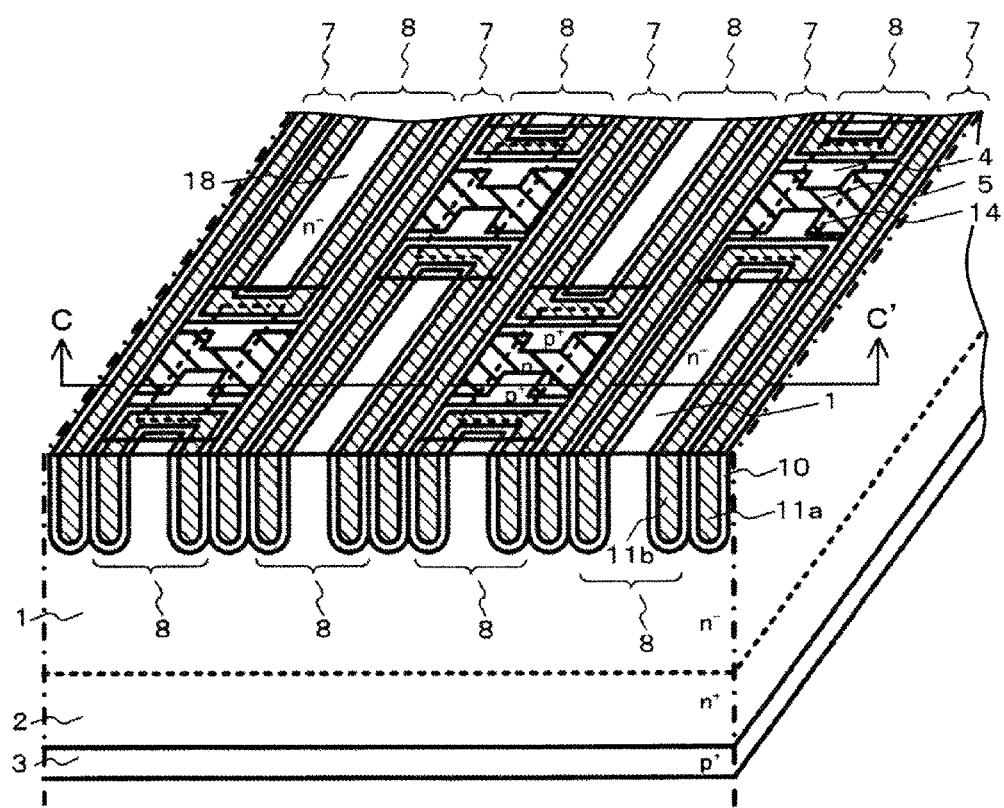
FIG. 23 is the oblique view of a semiconductor device according to an eighth embodiment of the invention.
Figure 26:
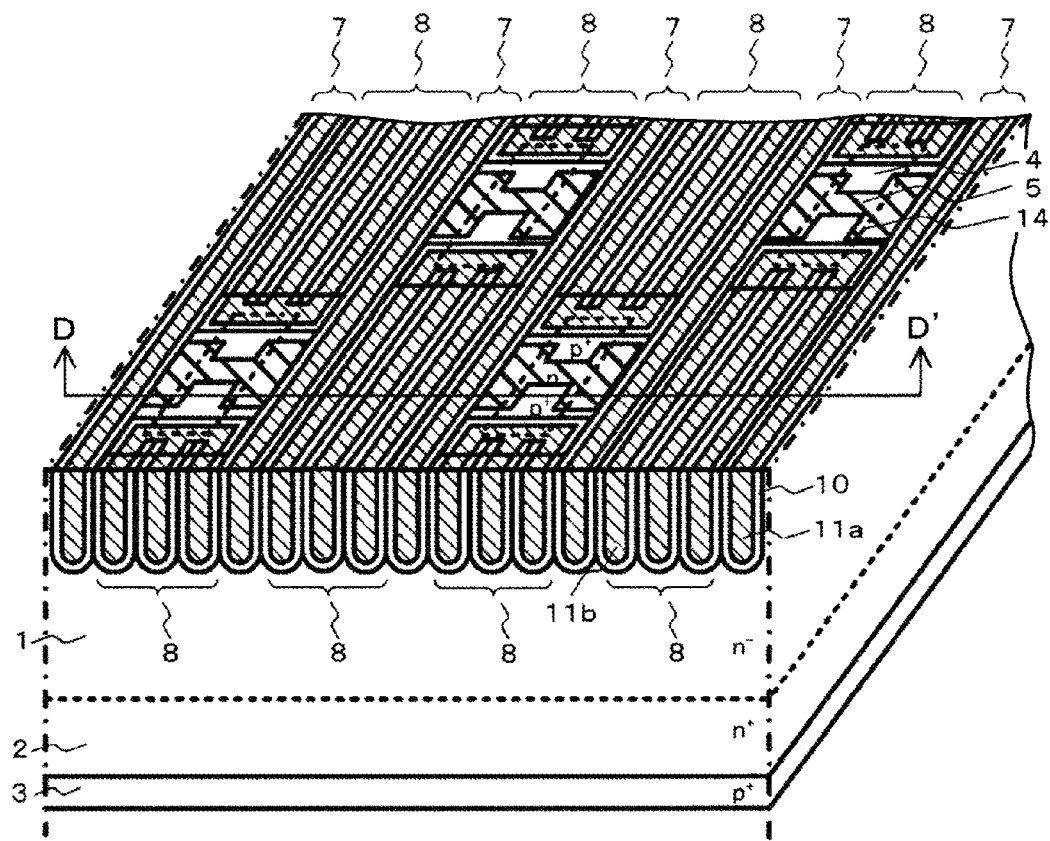
FIG. 26 is the oblique view of a semiconductor device according to a tenth embodiment of the invention.

FIG. 2 is a cross sectional view along the cutting-plane line A-A' in FIG. 1. In the following, the "cross sectional view" refers to the "cross sectional view along a cutting-plane line in an oblique view", if not indicated otherwise. In FIG. 2, emitter electrode 12, interlayer insulator film 9 that insulates emitter electrode 12 and gate polysilicon 11a in gate trench 7 from each other, and collector electrode 13, which are not shown in FIG. 1, are shown. (In FIGS. 5, 24, and 27, emitter electrode 12, interlayer insulator film 9, and collector electrode 13, which are not shown in FIGS. 4, 23, and 26, are shown in the same manner.) As shown in FIG. 2, dummy polysilicon 11b formed in dummy trench 8 may be connected to emitter electrode 12 with no problem. In detail, dummy polysilicon 11b may be exposed to contact opening 14 with no problem as shown in FIG. 1. The other connection methods will be described later.

The specific feature of the semiconductor device according to the first embodiment is to form dummy trench 8, different from gate trench 7, in mesa region 18 sandwiched by gate trenches 7 and by p-type base layers 4. When a voltage higher than the threshold voltage is applied to gate electrode 15 having a general MOS-type trench-gate structure, an inversion layer of electrons (channel) is formed in the contact plane of p-type base layer 4 in contact with the side wall of gate trench 7. According to the invention, dummy trench 8, that is a second trench, is arranged in the vicinity of mesa region 18 in contact with the side wall of gate trench 7 on the opposite side of the gate trench 7 side wall, in which the channel is formed. When a positive voltage is applied between collector electrode 13 and emitter electrode 12 in the state, in which gate electrode is set to be OFF (e.g. 0 V) in the structure described above, depletion layers expand from the pn-junction between n-type drift layer 1 and p-type base layer 4 and from the gate trench 7 side wall.

In the IGBT having the conventional structure, depletion layers expand in the following manner. FIG. 33 is a cross sectional view along the cutting-plane line AA-AA' in FIG. 32. Since any dummy trench 8 is not formed in mesa region 18 in the IGBT having the conventional structure shown in FIG. 33, depletion layers expand, in mesa region 18, only from the side walls of gate trenches 7 as shown by broken curves (16) that represent depletion layer edges 16. Therefore, especially in mesa region 18, the upper surface thereof is covered with interlayer insulator film 9, depletion layer edge 16, that is an equipotential surface, curves greatly as shown in FIG. 33. Since the capacitance Cgc between the collector and gate, that is the Miller capacitance (hereinafter referred to as the "Miller capacitance Cgc"), depends on the area of the equipotential surface, the Miller capacitance Cgc increases corresponding to the curve of the equipotential surface.

Since dummy trench 8 is formed in mesa region 18 according to the invention as shown in FIG. 2, the region, in which depletion layers expand, is narrower than the region, in which depletion layers expand in the IGBTs shown in FIGS. 32 and 33 (hereinafter referred to as the "conventional IGBTs"). Therefore, the depletion layers pinch off (the depletion layers expanding from different directions join each other) at a voltage lower than the voltage, at which the depletion layers pinch off in the conventional IGBTs. Therefore, the equipotential surface area is reduced and the Miller capacitance Cgc becomes small. As the Miller capacitance is reduced, the switching time or the switching loss is reduced.

Further, it is preferable to bury an electrical conductor in gate oxide film 10 formed on the side wall of dummy trench 8 as shown in FIG. 2. When a voltage is applied to gate electrode 15 or to collector electrode 13, a depletion layer expands into n-type drift layer 1. If an electrical conductor (here, dummy polysilicon 11b) is buried in dummy trench 8, depletion layers expand from the side walls of dummy trenches 8 in the same manner as from the side walls of gate trenches 7. As a result, the equipotential surfaces distribute in parallel to dummy trenches 8. Therefore, the depletion layers expanding from gate trenches 7 and dummy trenches 8 pinch off at a further smaller applied voltage and the equipotential surface area is reduced. Through the mechanism described above, the Miller capacitance Cgc is reduced.

It is further preferable to connect the electrical conductor (dummy polysilicon 11b) buried in dummy trench 8 to emitter electrode 12. The reason for this is as follows. When dummy polysilicon 11b is not connected to emitter electrode 12, a potential difference is caused between dummy trench 8 and emitter electrode 12 by the voltage applied to collector electrode 13 and an equipotential surface is formed. Further, interlayer insulator film 9 is formed between dummy trench 8 and emitter electrode 12. In many cases, interlayer insulator film 9 is formed of a silicon oxide film. Since the specific dielectric permeability of the silicon oxide film is about 3.9, that is a one-third of the specific dielectric permeability of silicon (11.9), equipotential surfaces localize in interlayer insulator film 9. Therefore, the equipotential surfaces are enhanced to curve by interlayer insulator film 9 in the conventional IGBT and the equipotential surface area increases.

In contrast, the equipotential surface curvature is relaxed substantially by forming dummy trench 8 according to the invention. Further, it is preferable to connect the electrical conductor (dummy polysilicon 11b) buried in dummy trench 8 to emitter electrode 12, since any potential difference is not caused across interlayer insulator film 9 between dummy trench 8 and emitter electrode 12 and the equipotential surface hardly enters interlayer insulator film 9. Since depletion layer edges 16 pinch off at a low applied voltage, the equipotential surface does not curve but distributes almost flatly below the bottoms of gate trench 7 and dummy trench 8. Therefore, the Miller capacitance Cgc is reduced further. Since the dummy polysilicon 11b potential is fixed always at the emitter electrode 12 potential, the dummy polysilicon 11b potential is stabilized, even if the internal state is changed by turning-on or turning-off, for example.

For connecting dummy polysilicon 11b to emitter electrode 12 (FIG. 2) as show in FIGS. 1 and 2, contact opening 14 in interlayer insulator film 9 (FIG. 2) is extended to the dummy trench 8 edges in the extending direction thereof and the dummy polysilicon 11b edges in the extending direction thereof are exposed. Dummy polysilicon 11b is connected to emitter electrode 12 via the exposed portions thereof (FIG. 2). As a result, dummy polysilicon 11b and emitter electrode 12 (FIG. 2) are fixed at the same potential more easily and preferably without forming any specific films (such as an electrical conductor film and an insulator film) or without adding any photolithographic process (mask process).

As shown in FIG. 2, it is also preferable for the distance Lgd between gate trench 7 and dummy trench 8 to be shorter than the width Wbi, perpendicular to the substrate major surface, of the depletion layer (hereinafter referred to as the "depletion layer width") that expands from p-type base layer 4 in the thermal equilibrium state. Due to the equilibrium conditions between the carrier drift current and the diffusion current, depletion layers have expanded already in the thermal equilibrium state generally in the vicinity of a pn-junction. In the IGBT structure according to the invention, pn-junction 19 between p-type base layer 4 and n-type drift layer 1 corresponds to the pn-junction described above.

Hereinafter, the depletion layer in the thermal equilibrium state will be referred to as the "built-in depletion layer". Almost all the built-in depletion layers expand toward n-type drift layer 1 doped more lightly than p-type base layer 4. Therefore, a depletion layer expands also to the gate trench 7 side wall in the vicinity of p-type base layer 4. Since a depletion layer expands also from the gate trench 7 side wall on the opposite side of the gate trench 7 side wall in contact with p-type base layer 4, a built-in depletion layer expands a little bit between gate trench 7 and dummy trench 8 formed between gate trenches 7. In other words, if the built-in depletion layer reaches dummy trench 8, mesa region 18 between gate trench 7 and dummy trench 8 will be depleted in the thermal equilibrium state without applying a voltage between the collector and emitter. Therefore, it is possible to make the Miller capacitance exhibit a small value corresponding to the capacitance of the built-in depletion layer.

Figure 31:
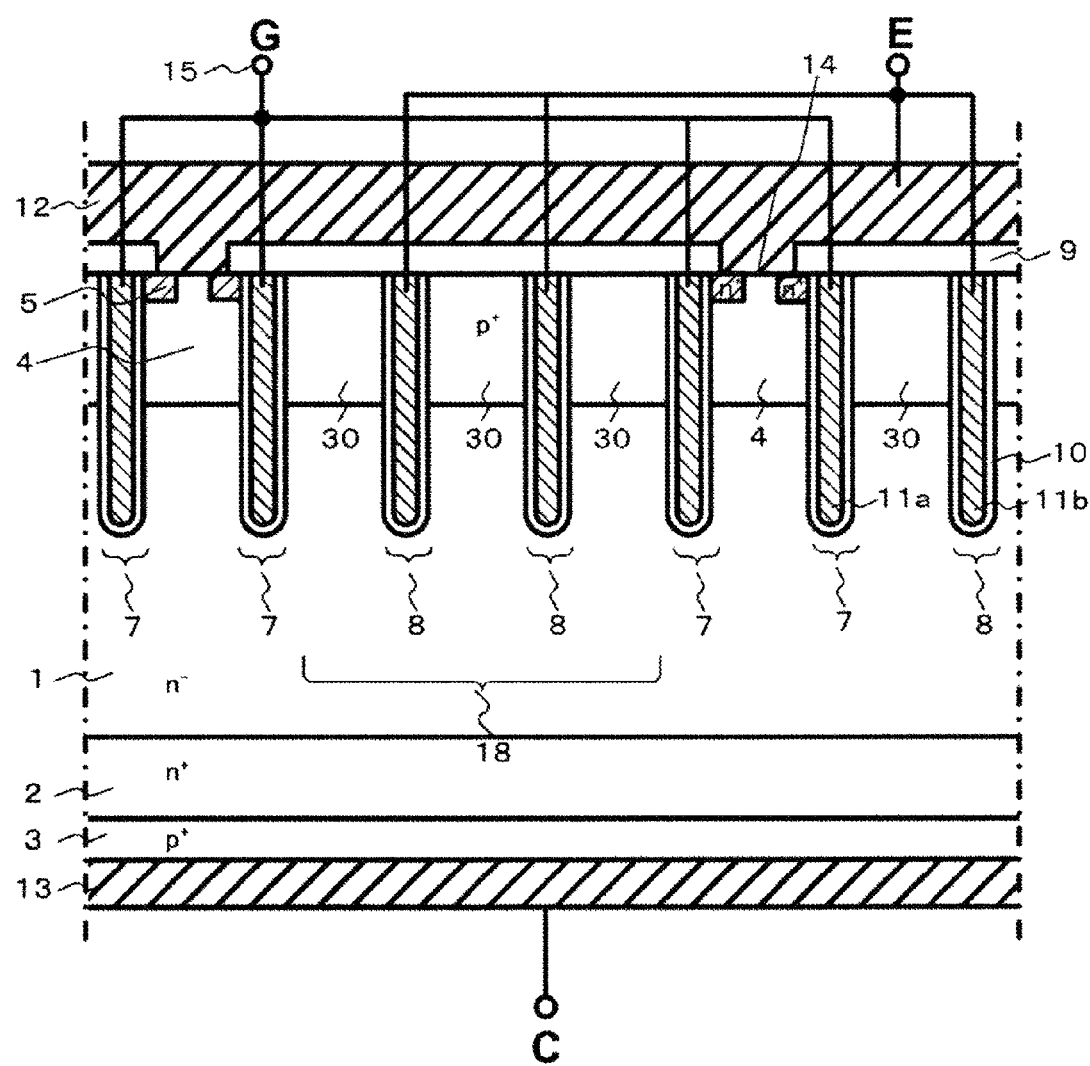
FIG. 31 is the cross sectional view of a conventional semiconductor device.

In addition to the specific features which the semiconductor device according to the first embodiment exhibits, there exists another important specific feature which only the semiconductor device according to the invention exhibits. The specific feature according only to the invention is as follows. Among mesa regions 18 sandwiched between scattered p-type base layers 4, mesa region 18 between dummy trench 8 and gate trenches 7 is connected to emitter electrode 12 via p-type base layer 4. As described earlier in connection with the problems to be soled by the invention, the combination of conventional floating p-type layer 30 and dummy trench 8 (cf. FIG. 31) obtains the IE effect and the Miller capacitance reduction effect to some extents. In the conventional IGBT shown in FIG. 31 however, the potential of mesa region 18 between dummy trench 8 and gate trenches 7 increases rapidly in the turn-on process and the turn-on di/dt increases rapidly. The phenomenon is uncontrollable by adjusting the gate resistance as described above. To recover the gate controllability, the emitter electrode is connected to mesa region 18 between dummy trench 8 and gate trenches 7. In the reaction against (in compensation for) the gate controllability recovery, the IE effect is reduced. After all, it has been impossible to form dummy trench 8 in the trench IGBT including floating p-type layer 30 and to connect the emitter electrode to mesa region 18 between dummy trench 8 and gate trenches 7.

Figure 32:
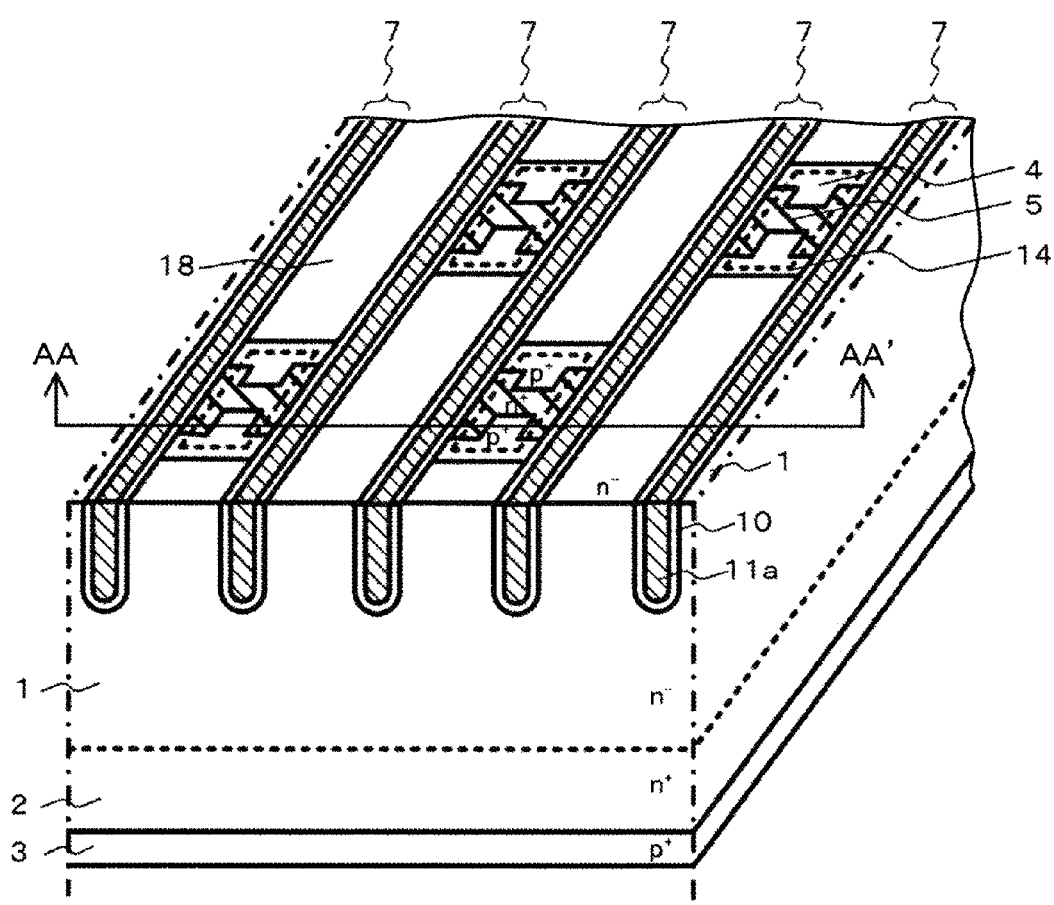
FIG. 32 is the oblique view of the other conventional semiconductor device.
Figure 33:
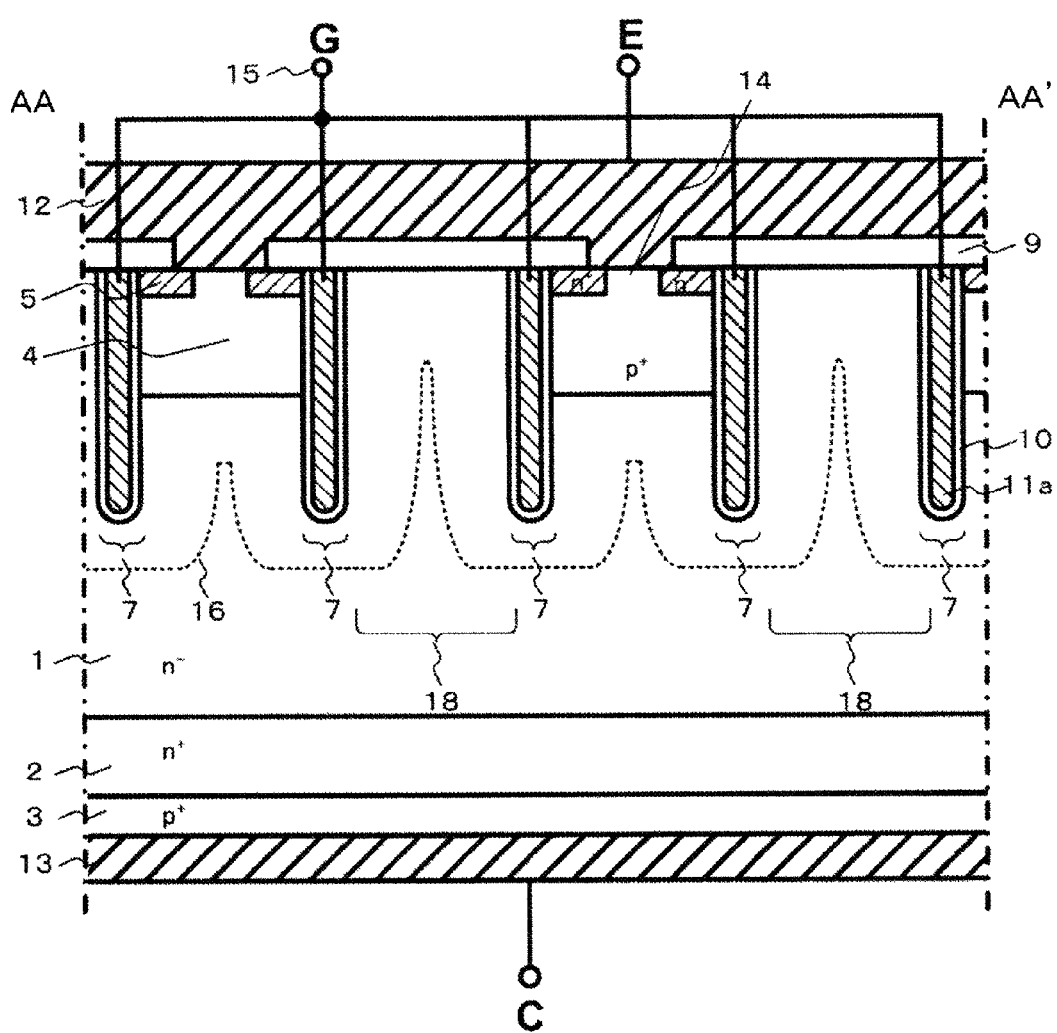
FIG. 33 is a cross sectional view along the cutting-plane line AA-AA' in FIG. 32.

According to the invention, dummy trench 8 interrupts the path, through which the holes injected from p-type collector 3 to n-type drift layer 1 flow from mesa region 18 in the structure shown in FIG. 32 to p-type base layer 4 in the process of turn-on. Therefore, even if mesa region 18 between dummy trench 8 and gate trenches 7 is connected to emitter electrode 12 via p-type base layer 4, the holes will be accumulated rather in the vicinity p-type base layer 4. Therefore, the IE effect is enhanced more according to the invention than by the conventional IGBT shown in FIG. 32 or 31. The effects described above are obtained only by the structure, in which mesa region 18 between dummy trench 8 and gate trench 7 among mesa regions 18 between p-type base layers 4 arranged in a scattered manner is connected to emitter electrode 12 via p-type base layer 4. Therefore, the effects described above are expected neither from the conventional IGBT structure shown in FIG. 31 that combines floating p-type layer 30 and dummy trench 8 nor from the IGBT structure shown in FIG. 32.

Now the method for manufacturing the semiconductor device according to the first embodiment will be described below.

First, an oxide film is formed on a substrate by thermal oxidation and such technique. A resist mask including openings for forming gate trench 7 and dummy trench 8 is formed by photolithography on the upper surface of the substrate that will work as an n-type drift layer 1. Then, the oxide film is etched using the resist mask for an etching mask to form an oxide film mask for trench etching. After removing the resist, trench etching is conducted by anisotropic etching to form gate trench 7 and dummy trench 8 in the substrate upper surface. Then, the oxide film mask is removed by wet etching.

Then, gate oxide film 10 is formed in gate trench 7 and dummy trench 8 by thermal oxidation. In gate trench 7 and dummy trench 8, polycrystalline silicon (hereinafter referred to as "polysilicon") doped with phosphorus and such an impurity is deposited by the chemical vapor phase deposition method (hereinafter referred to as the "CVD method"). By the CVD method, gate polysilicon 11a and dummy polysilicon 11b are deposited in gate trench 7 and dummy trench 8, respectively.

Then, a resist mask, including an opening for forming p-type base layer 4, is formed on the substrate upper surface by photolithography. Then, boron ions are implanted into the substrate upper surface using the resist mask for a mask for ion implantation. By the ion implantation, p-type base layer 4 is formed in the substrate upper surface selectively. Then, the resist mask is removed.

Then, the impurity (boron) for forming p-type base layer 4 is diffused by a thermal treatment. Since gate trench 7 has been formed already, gate oxide film 10 suppresses the boron diffusion across gate trench 7. Therefore, the lateral diffusion of p-type base layer 4 is limited to the direction parallel to (in the extending direction of) gate trench 7. The spacing between p-type base layers 4 in the extending direction of gate trench 7 is set at the length, at which mesa region 18, in which dummy trench 8 is formed, is kept at the n-type conductivity.

Then, a resist mask, including an opening for forming n-type emitter layer 5, is formed on the substrate upper surface by photolithography. Then, arsenic ions, for example, are implanted into the substrate upper surface using the resist mask for a mask for ion implantation. By the ion implantation and subsequent anneal, n-type emitter layer 5 is formed in the surface portion of p-type base layer 4 selectively. After the resist mask is removed, a silicon oxide film, that will be interlayer insulator film 9, is deposited by the CVD method well known to the persons skilled in the art.

Then, a resist mask, including an opening for forming contact opening 14, is formed on the surface of interlayer insulator film 9 by photolithography. Using the resist mask for a mask, contact opening 14 is formed in interlayer insulator film 9 by etching. Then, a metal film such as an aluminum film is deposited on the upper surface side of the substrate such that the metal film fills contact opening 14. Thus, emitter electrode 12, in contact with p-type base layer 4 and n-type emitter layer 5, is formed.

Then, a protector film such as a polyimide film is deposited to cover emitter electrode 12. A pad is opened through the protector film by photolithography. The pad opening is an opening for connecting the emitter electrode to an aluminum wire or to a lead frame in packaging a chip in an IGBT module or in a mold in the so-called after step after chip dicing.

Then, the substrate is thinned by grinding or by polishing from the substrate back surface side by the back grinding technique or by the wet etching technique. Then, ions which work as a donor such as phosphorus and protons are implanted from the substrate back surface. Then, the acceptor ions such as boron ions are implanted from the substrate back surface. The acceleration energy, at which the donor impurities (protons, phosphorous ions) are implanted into the substrate back surface for the first time, is higher than the acceleration energy, at which acceptor impurities (boron ions, aluminum ions) are implanted subsequently. The donor impurity and the acceptor impurity may be implanted into the substrate back surface in the order opposite to the ion implantation order described above with no problem.

Then, laser annealing is conducted by the single pulse irradiation or by the double pulse irradiation from a laser (e.g. the well known YAG2ω). Through the hydrogen-related donor formation by protons, n-type field stop layer 2 is formed. By activating the boron atoms, p-type collector layer 3 is formed. Through the steps described above, the semiconductor device shown in FIG. 1 is completed.

Working Example 1

Now the method for manufacturing the semiconductor device according to the invention will be described in detail below in connection with a working example 1. An IGBT of the 600 V class (cf. FIGS. 1 and 2) is obtained according to the first embodiment. First, a silicon wafer (substrate), the specific resistance thereof is 20 Ωcm or higher and 35 Ωcm or lower, is prepared. The specific resistance is set to be 30 Ωcm in the working example 1. Of course, the invention is applicable to the semiconductor devices of the other breakdown voltage classes. The specific resistance is set to be high corresponding to the breakdown voltage class. For example, the specific resistance is set to be 40 Ωcm or higher and 60 Ωcm or lower for the 1200 V class, 60 Ωcm or higher and 90 Ωcm or lower for the 1700 V class, and 100 Ωcm or higher and 250 Ωcm or lower for the 3500 V class. As the breakdown voltage is higher, it is necessary to set the wafer specific resistance to be higher. Therefore, the built-in depletion layer becomes wider and, as a result, the Miller capacitance reduction effect is enhanced.

Now the typical width of a built-in depletion layer will be described below. It is known that if the voltage, that builds a built-in depletion layer of the pn-junction in the thermal equilibrium state (e.g. 300 K or 27° C.), is represented by a built-in voltage Vbi [V], Vbi will be given by $Vbi=0.0259 \times \ln(N_A N_D / n_o^2)$. Here, $N_A$ is the acceptor concentration in the p-type layer, $N_D$ the donor concentration in the n-type layer, and $n_o$ the intrinsic carrier concentration, that is $1.45 \times 10^{10}/cm^3$ for silicon at 300 K.

For a one-sided stepwise junction, in which $N_A \gg N_D$, the width Wbi of the built-in depletion layer is expressed approximately by $(2 \in Vbi/(qN_D))^{1/2}$. Here, $\in$ is the dielectric permeability of silicon and q the elementary electric charge quantity. The acceptor concentration $N_A$ in the p-type layer is set to be $1.0 \times 10^{18}/cm^3$ temporarily. If the specific resistance is represented by $\rho[\Omega cm]$, the donor concentration $N_D$ of the n-type layer is represented generally by $4.596 \times 10^{15}/\rho$ for silicon. Therefore, when the specific resistance is 30 Ωcm, Vbi is 0.71 V and Wbi 2.5 µm. When the specific resistance is 50 Ωcm, Vbi is 0.69 V and Wbi 3.2 µm. When the specific resistance is 75 Ωcm, Vbi is 0.68 V and Wbi 3.8 µm. When the specific resistance is 175 Ωcm, Vbi is 0.66 V and Wbi 5.8 µm.

Trenches are formed by conducting trench etching of around 5 µm in the wafer surface (substrate upper surface) using the anisotropic etching technique. Since gate trench 7 and dummy trench 8 are laid out using the same mask, it is possible to form gate trench 7 and dummy trench 8 simultaneously. In the layout mask, the widths of gate trench 7 and dummy trench 8 in the direction perpendicular to the extending direction thereof are set to be 1 µm, respectively. The distance Lgd between gate trench 7 and dummy trench 8 is set to be 2 µm.

Since the built-in depletion layer width Wbi is 2.5 µm in the working example 1, the spacing Lgd between gate trench 7 and dummy trench 8 is smaller than the built-in depletion layer width Wbi. Through the subsequent steps, the widths of gate trench 7 and dummy trench 8 in perpendicular to the extending direction thereof become wider by around 10% from 1 µm by thermal oxidation and such causes. As a result, the distance Lgd between gate trench 7 and dummy trench 8 becomes narrower by 20% from 2 µm. In gate trench 7 and dummy trench 8, gate oxide film 10 around 100 nm in width is formed by thermal oxidation.

Then, polycrystalline silicon (polysilicon) doped with phosphorus and such an impurity is deposited by the chemical vapor phase deposition method (CVD method) and such methods. By the deposition, gate polysilicon 11a and dummy polysilicon 11b are loaded in gate trench 7 and dummy trench 8, respectively. Gate polysilicon 11a and dummy polysilicon 11b are doped with a dopant heavily enough to make gate polysilicon 11a and dummy polysilicon 11b exhibit electrical conductivity. For example, the sheet resistance of the polysilicon described above is 1Ω/☐ or higher and 50Ω/☐ (ohm/square) or lower. In other words, any material that exhibits electrical conductivity may be buried in gate trench 7 and dummy trench 8 with no problem. For example a high-temperature-melting metal such as platinum may be used with no problem. If one considers the necessity of preventing gate oxide film 10 from being contaminated by heavy metals, electrically conductive polysilicon will be preferable.

The, boron ions are implanted into the wafer surface using a photoresist to form p-type base layer 4 selectively. For setting the junction depth of p-type base layer 4 to be around 3 µm, driving-in diffusion is conducted at a high temperature, e.g. around 1100° C., and for several hours. The length of p-type base layer 4 in the extending direction of gate trench 7 is set to be 8 µm. The spacing between p-type base layers 4, adjacent to each other across mesa region 18, is set to be 30 µm in the extending direction of gate trench 7. The unit length in the cyclic structure of p-type base layer 4 and gate trench 7 is set to be 5 µm. Then, the photoresist is removed once. Using a photoresist again, arsenic ions and such ions are implanted and the wafer is annealed around 1000° C. to form n-type emitter layer 5.

Then, the photoresist is removed. A silicon oxide film, around 1 µm in thickness, is deposited by the well-known CVD method to form interlayer insulator film 9. Contact opening 14 is formed through interlayer insulator film 9 using a photoresist pattern and, then, a metal film such as an aluminum film is deposited to form emitter electrode 12. Further, a protector film such as a polyimide film is formed and a pad portion for connecting the emitter electrode to an aluminum wire or a lead frame is opened through the protector film using a photoresist pattern.

Then, the wafer back surface is ground or polished by back grinding or by wet etching to the total silicon wafer thickness of 50 µm or thicker and 60 µm or thinner. Since the total wafer thickness after the grinding is different depending on the breakdown voltage class, the total wafer thickness is adjusted appropriately. Then, protons are implanted from the wafer back surface at the acceleration energy of 1 MeV or higher and 8 MeV or lower and at the dose amount of $1.0 \times 10^{14}/cm^3$ or more and $1.0 \times 10^{15}/cm^2$ or less. Subsequently, boron ions are implanted also from the wafer back surface at the acceleration energy of 10 keV or higher and 100 keV or lower and at the dose amount of $1.0 \times 10^{13}/cm^3$ or more and $1.0 \times 10^{15}/cm^2$ or less. Then, laser annealing is conducted to the wafer back surface by single pulse irradiation or by double pulse irradiation from a laser (e.g. the well known YAG2ω) at the energy density of 1 J/cm². Through the ion implantation and annealing steps, n-type field-stop layer 2 and p-type collector layer 3 are formed.

Working Example 2

Now the effects according to the first embodiment will be investigated below. Here, the descriptions will be made by comparing the IGBT according to the first embodiment with the conventional IGBT shown in FIG. 32.

First, an IGBT that includes one dummy trench 8 between adjacent gate trenches 7 (hereinafter referred to sometimes as a "first IGBT") is fabricated according to the first embodiment. The manufacturing method and the manufacturing conditions are the same with those in the working example 1. For the sake of comparison, an IGBT (conventional IGBT, cf. FIG. 32) that includes no dummy trench 8 between adjacent gate trenches 7 is fabricated. The conventional IGBT is fabricated with the parameters the same with those in the working example 1. The length of p-type base layer 4 in the extending direction of gate trench 7 is set to be 8 µm, the same with that in the working example 1. The spacing between adjacent p-type base layers 4 in the extending direction of gate trench 7 is set to be the same with that in the working example 1. The unit period in the cyclic structure of p-type base layer 4 and gate trench 7 in perpendicular to the extending direction of gate trench 7 is set to be the same with that in the working example 1. The electrostatic capacitance $C_X$ and the collector-emitter voltage $V_{CE}$ are measured for the first IGBT and for the conventional IGBT, and the electrical characteristics thereof are investigated.

Figure 3:
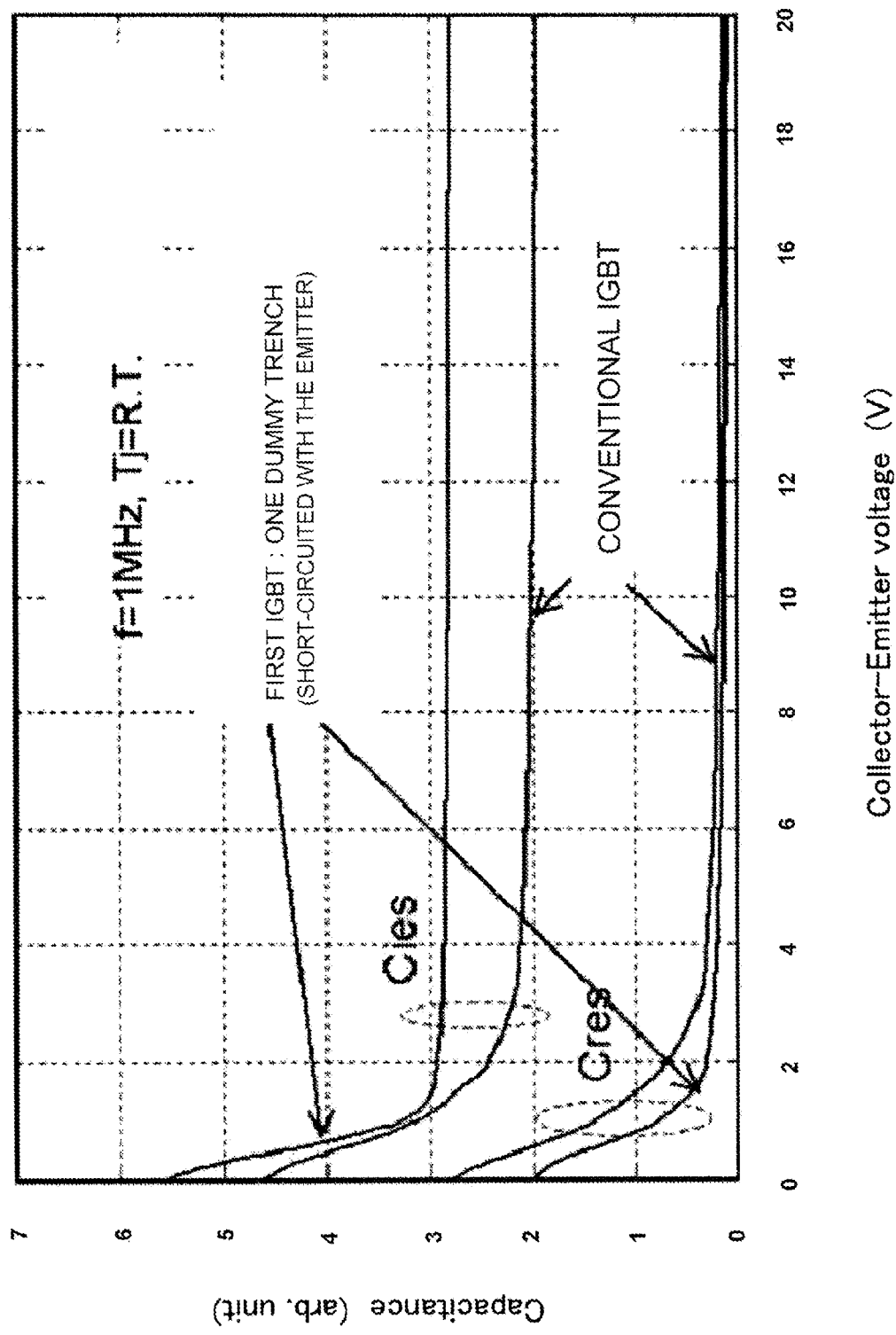
FIG. 3 is a graph relating the electrostatic capacitance with the collector-emitter voltage for the IGBTs of a working example 1.

FIG. 3 is a graph relating the electrostatic capacitance with the collector-emitter voltage for the IGBTs of the working example 1. FIG. 3 shows the dependence of the input capacitance Cies and the feedback capacitance Cres on the voltage applied between the collector and emitter (C-V characteristics) in the semiconductor devices of the working example 1.

The input capacitance Cies is defined by Cies=Cge+Cgc. Here, Cge is the capacitance between the gate and emitter (gate-emitter capacitance).

The output capacitance Coes is expressed by Coes=Cce+Cgc. Here, Cce is the capacitance between the collector and emitter (collector-emitter capacitance). The feedback capacitance Cres is the same with the capacitance between the gate and collector (gate-collector capacitance), that is Cres=Cgc. The feedback capacitance Cres is calculated from the measured values of the input capacitance Cies and the output capacitance Coes. Since the electrostatic capacitance directly measured between the gate electrode and the collector electrode is the sum of Cge and Cce, Cx will be Cge plus Cce, if the sum is represented by Cx.

On the other hand, the electrostatic capacitance Cx may be considered that Cx=(Cies−Cgc)+(Coes−Cgc). Form the equation described above, the gate-collector capacitance Cgc is obtained from Cgc=(Cies+Coes−Cx)/2. An impedance analyzer HP-4192A supplied from Hewlett-Packard Company is used for the capacitance measurement. The AC frequency is set at 1 MHz for the measurement. The input capacitance Cies is measured by connecting an externally added capacitor in parallel between the collector and emitter to compensate the collector-emitter capacitance Cce. The output capacitance Coes is measured by connecting an externally added capacitor in parallel between the gate and emitter to compensate the gate-emitter capacitance Cge. The electrostatic capacitance Cx is measured by connecting an externally added capacitor in parallel between the gate and collector to compensate the gate-collector capacitance Cgc.

The results described in FIG. 3 indicate that the feedback capacitance Cres is reduced by the first IGBT, although the input capacitance Cies increases in comparison with that of the conventional IGBT (cf. FIG. 32). Especially when the collector-emitter voltage is lower than 4 V, the feedback capacitance Cres (Miller capacitance) is reduced, at the maximum, to 50% of the feedback capacitance of the conventional IGBT.

As described above, dummy trench 8 is formed between adjacent gate trenches 7 (in mesa region 18) according to the first embodiment. The provision of dummy trench 8 pinches off the depletion layers expanding from gate trenches 7, even when the voltage applied between the collector and emitter is low, and the equipotential surface area reduces. By the mechanism, a semiconductor device, the Miller capacitance Cgc thereof is small, is obtained. By the Miller capacitance reduction, the switching time or the switching loss is reduced. Therefore, a semiconductor device that exhibits a low switching loss is obtained.

Second Embodiment

Now a semiconductor device according to a second embodiment of the invention will be described below with reference to FIG. 4. FIG. 4 is the oblique view of the semiconductor device according to the second embodiment. The semiconductor device according to the second embodiment is different from the semiconductor device according to the first embodiment in the number of dummy trenches 8 in mesa region 18. According the second embodiment, two dummy trenches 8 are formed between adjacent gate trenches 7 in a planar stripe-shaped layout. The distal end portions of dummy trenches 8 in mesa region 18 in the extending direction thereof are connected to each other.

Figure 5:
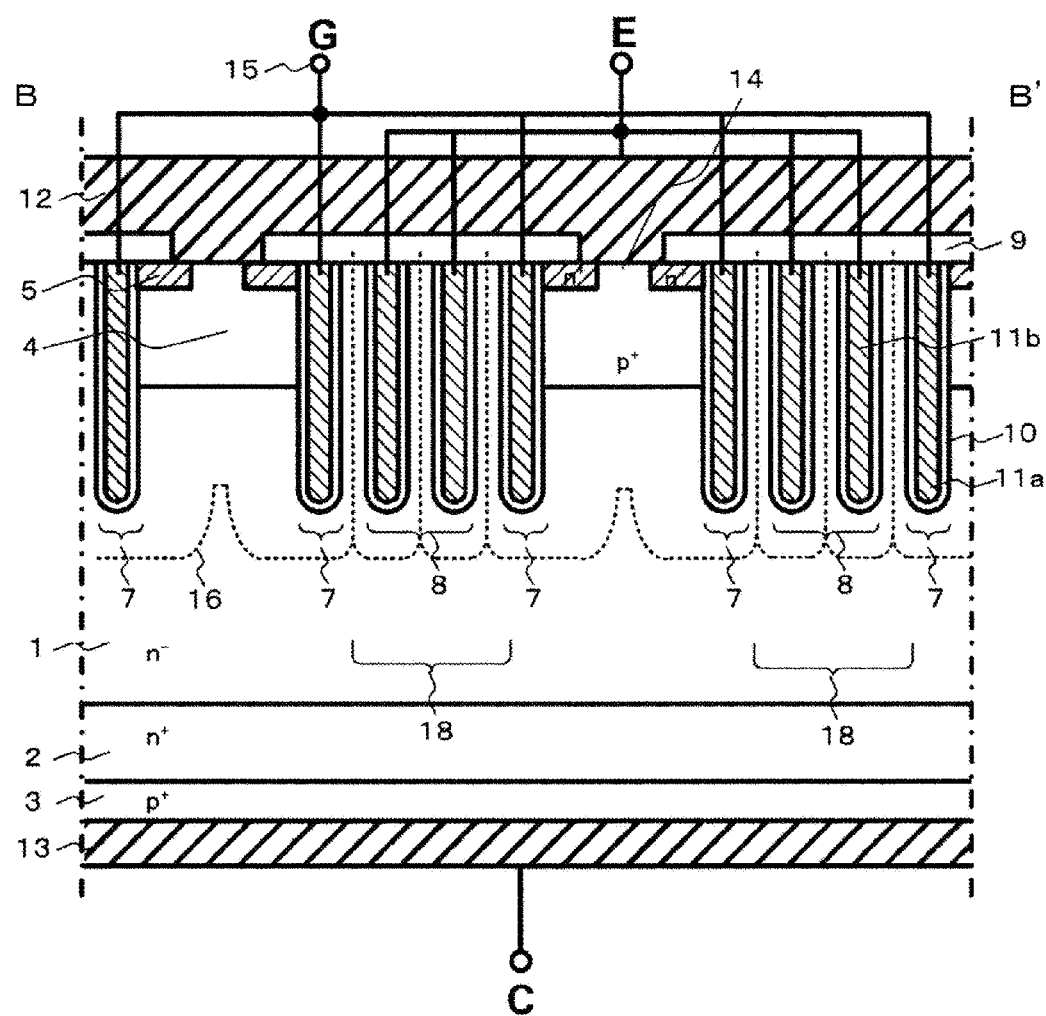
FIG. 5 is the cross sectional view along the cutting-plane line B-B' in FIG. 4.

FIG. 5 is the cross sectional view along the cutting-plane line B-B' in FIG. 4. Dummy polysilicon 11b formed in dummy trench 8 is connected to emitter electrode 12. For the practical connection, the distal end portion of dummy polysilicon 11b may be exposed into contact opening 14 as shown in FIG. 4 with no problem.

By forming a plurality of dummy trenches 8 in the same manner as according to the second embodiment, the distance between gate trench 7 and dummy trench 8 or the distance between adjacent dummy trenches 8 can be shortened. As a result, the depletion layer that expands from dummy trench 8 adjacent to gate trench 7 is pinched off at a lower applied voltage. As depletion layer edge 16 represented by the broken curve in FIG. 5 shows, the equipotential surface below the bottom of gate trench 7 or dummy trench 8 becomes further closer to a flat shape. As a result, the area of the equipotential surface becomes narrow especially at a low applied voltage. Therefore, the Miller capacitance is reduced, the electric field strength in the trench bottom is relaxed, and the breakdown voltage is prevented from lowering.

When a plurality of dummy trenches 8 is formed, it is preferable to set the potentials of dummy polysilicon 11b in respective dummy trenches 8 to be the same. By fixing the potentials of dummy polysilicon 11b in respective dummy trenches 8 at the same value, it is possible for dummy polysilicon 11b to follow stably the potential variations caused in the chip by the turn-on or turnoff of the IGBT.

For setting the potentials of dummy polysilicon 11b in respective dummy trenches 8 to be the same, it is preferable to connect dummy polysilicon 11b in dummy trenches 8 by connecting dummy trenches 8 to each other at the distal end portions thereof in the extending direction of dummy trench 8. By connecting a plurality of dummy polysilicon 11b in dummy trenches 8 in the distal end portions thereof, it is possible to set the radius of curvature of the distal end portions of dummy trenches 8 to be large. Therefore, when depletion layers expand by a high voltage applied between the collector and emitter, the electric field is prevented from localizing to the distal end portion of dummy trench 8.

In detail, for setting the potentials of dummy polysilicon 11b in respective dummy trenches 8 to be the same, the distal end portion of dummy polysilicon 11b is exposed to contact opening 14. And, the exposed distal end portion of dummy polysilicon 11b is connected to the metal that forms the emitter electrode. As a result, the potential of dummy polysilicon 11b is set at the emitter electrode potential without using a complicated mask layout, without conducting an extra electrode film formation or without adding an extra photolithographic process.

It is preferable to connect the electrical conductor (dummy polysilicon 11b) buried in dummy trench 8 to emitter electrode 12 in the same manner as according to the first embodiment as shown in FIG. 5. The reason for this is the same with that according to the first embodiment. As a result, the Miller capacitance is reduced in the same manner as according to the first embodiment. Especially by forming a plurality of dummy trenches 8 in the same manner as according to the second embodiment, the equipotential surfaces distribute more flatly and the Miller capacitance reduction effect is further enhanced. Even if the internal state is changed by turning-on or turning-off, for example, the dummy polysilicon 11b potential is fixed always at the emitter electrode 12 potential. Therefore, the dummy polysilicon 11b potential is stabilized. Especially by forming a plurality of dummy trench 8 in the same manner as according to the second embodiment, the rate of dummy polysilicon 11b at the potential the same with the emitter electrode 12 potential in mesa region 18 becomes large. As a result, the mesa region 18 potential is further stabilized even at the time of switching.

Figure 29:
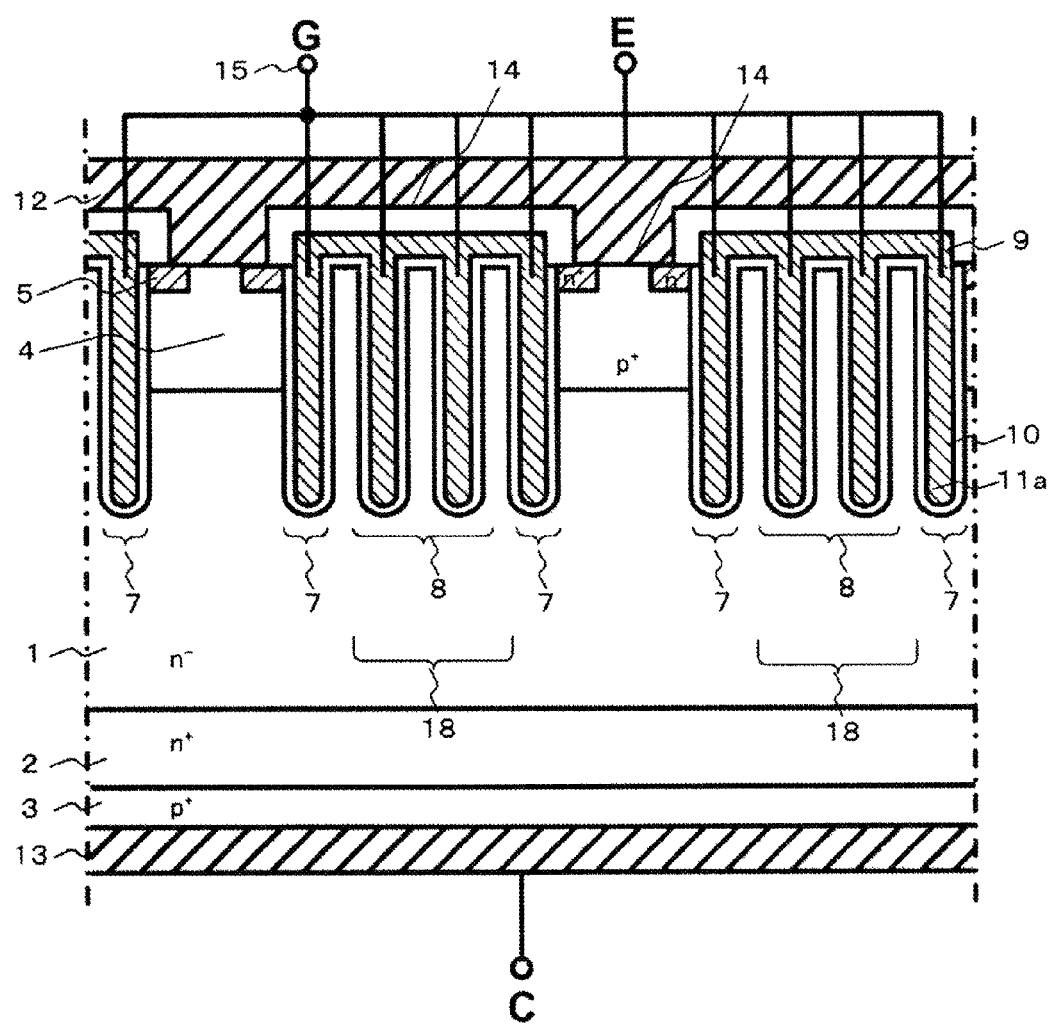
FIG. 29 is the cross sectional view of a semiconductor device for a comparative example.

FIG. 29 is the cross sectional view of a semiconductor device for a comparative example. In the same manner as in the IGBT shown in FIG. 29, it is worthwhile considering to connect the dummy polysilicon in dummy trench 8 in mesa region 18 to gate polysilicon 11a to set the dummy polysilicon at the same potential with that of gate polysilicon 11a. In this case, the Miller capacitance Cgc rather increases unpreferably as compared with that in the conventional IGBT, since the area of gate polysilicon 11a facing to collector electrode 13 increases.

Figure 6:
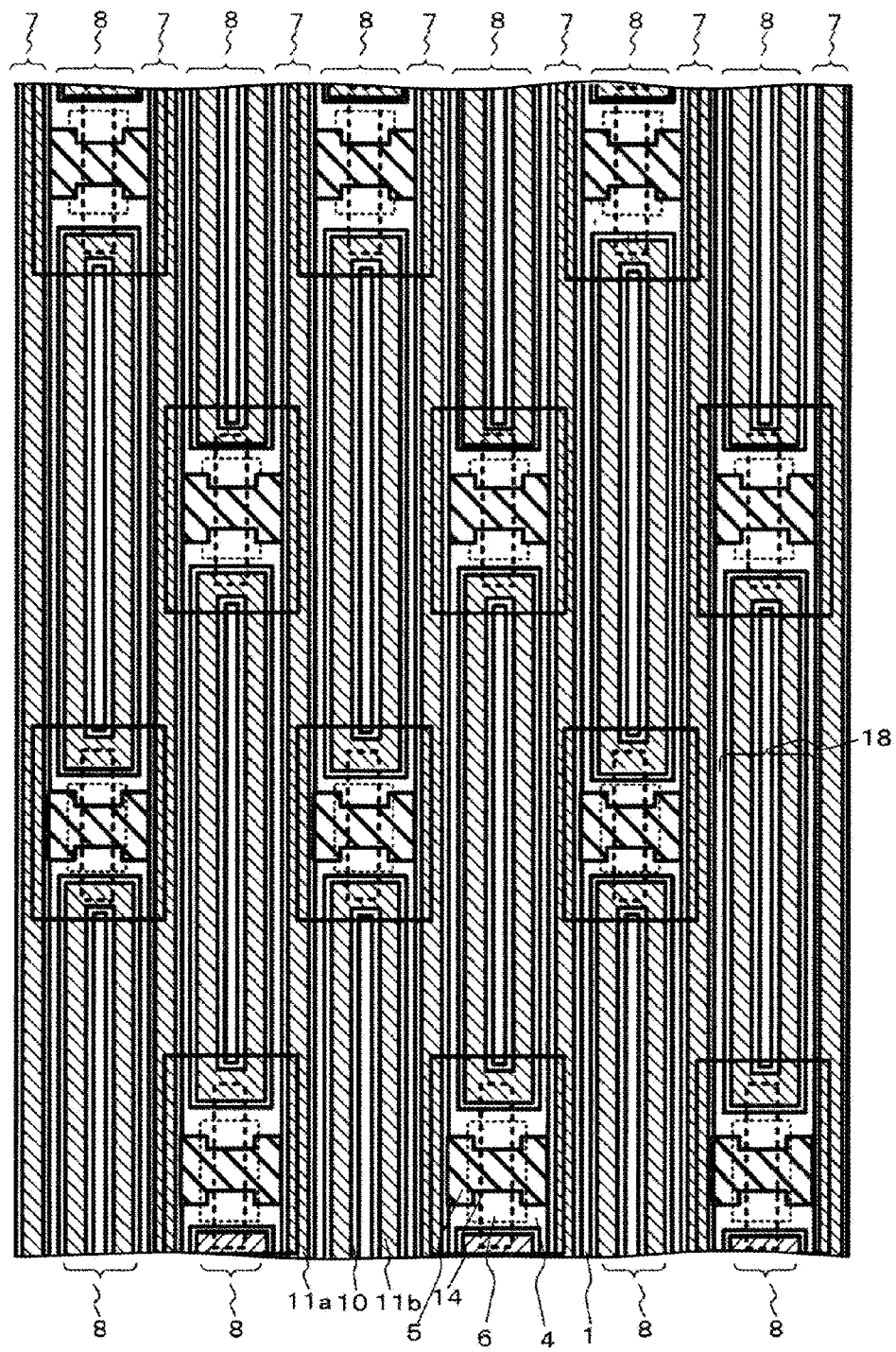
FIG. 6 is the top plan view of the semiconductor device shown in FIG. 4.

FIG. 6 is the top plan view of the semiconductor device shown in FIG. 4. It is preferable for p-type base layers 4 to be arranged in mesa regions 18 between gate trenches 7 in a checkered pattern. Two dummy trenches 8 are formed between p-type base layers 4 adjacent to each other in mesa region 18. By the arrangement described above, it is possible to distribute the equipotential surfaces in the OFF-state uniformly in the state close to a plane junction. By distributing dummy trenches 8 in a checkered pattern, the potential distribution in mesa region 18 becomes uniform. The arrangement described above makes it possible to prevent the electric field from localizing to the trench bottom. It is also possible to make the current distribution in the chip in the ON-state uniform. Of course, the same effects are obtained by the semiconductor device according to the first embodiment, in which one dummy trench 8 is between two gate trenches 7 (cf. FIG. 1).

In p-type base layer 4 in FIG. 6, p-type contact layer 6, doped more heavily than p-type base layer 4, is formed to suppress the well-known collector current latch-up. Here, the latch-up is the phenomenon, in which the parasitic thyristor built-in an IGBT turns on and it becomes impossible to perform the turnoff control and such a control by gate electrode 15. The formation of p-type contact layer 6 is the technique well known to the persons skilled in the art. The formation of p-type contact layer 6 is not described in connection with the other embodiments of the invention. However, p-type contact region 6 may be formed in the same manner as according to the second embodiment with no problem.

Working Example 3

Figure 7:
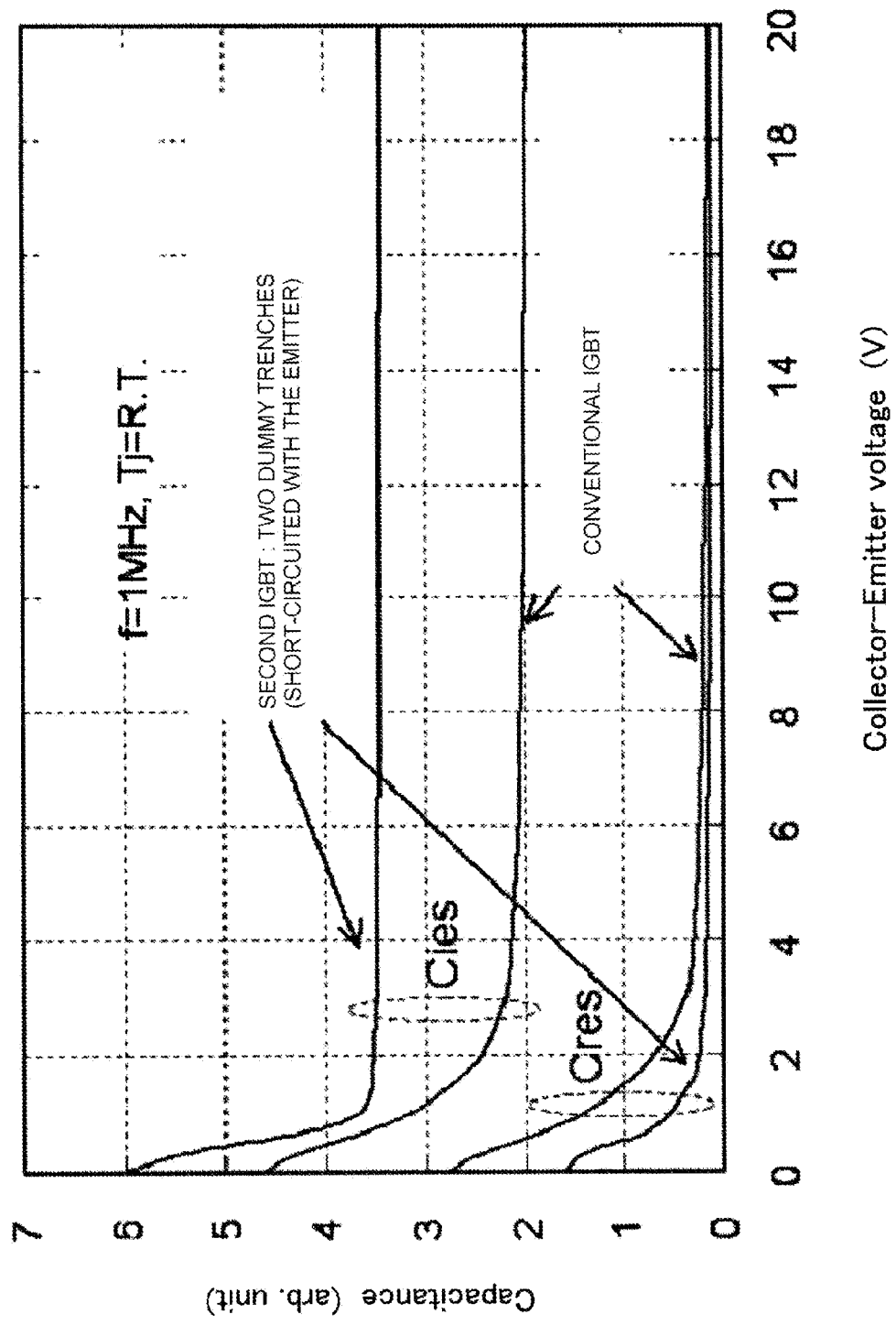
FIG. 7 is a graph describing the electric characteristics of the semiconductor devices for a working example 3.

Now the effects of the semiconductor device according to the second embodiment will be investigated below. FIG. 7 is a graph describing the electric characteristics of the semiconductor devices for a working example 3. FIG. 7 compares the dependence of the input capacitance Cies and the feedback capacitance Cres of the IGBT according to the second embodiment on the collector-emitter voltage $V_{CE}$ (C-V characteristics) and the dependence of the input capacitance Cies and feedback capacitance Cres of the conventional IGBT on the collector-emitter voltage $V_{CE}$ (C-V characteristics) with each other.

First, an IGBT according to the second embodiment that includes two dummy trenches 8 between adjacent gate trenches 7 (hereinafter referred to sometimes as a "second IGBT") is fabricated. The other design conditions for the second IGBT are the same with those of the first IGBT. For the sake of comparison, a conventional IGBT is fabricated in the same manner as in the working example 2. The electrostatic capacitance Cx and the collector-emitter voltage Vice are measured for the second IGBT and for the comparative IGBT to investigate the electric characteristics of the IGBTs. The measurement method and the calculation method are the same with those in the working example 2.

The results described in FIG. 7 indicate that the feedback capacitance Cres (Miller capacitance) is reduced in the working example 3 as compared with that in the conventional IGBT in the same manner as in the working example 2. Especially, the IGBT for the working example 3 that includes two dummy trenches makes the Miller capacitance Cres smaller and reduces the Miller capacitance thereof to 30% of the Miller capacitance in the conventional IGBT at the maximum.

Working Example 4

Figure 8:
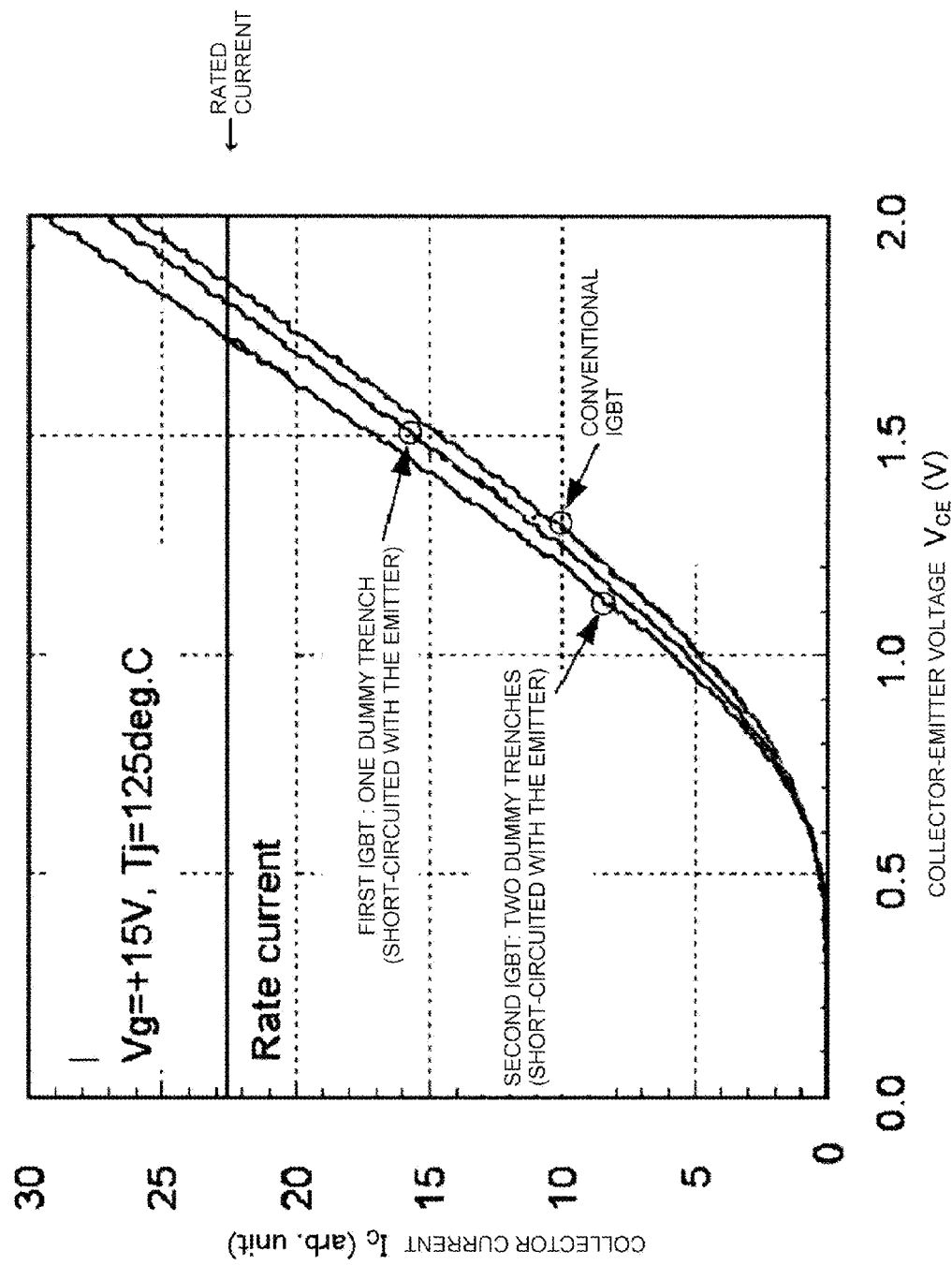
FIG. 8 is a graph describing the electric characteristics of the semiconductor devices for a working example 4.

FIG. 8 is a graph describing the electric characteristics of the semiconductor devices for a working example 4. FIG. 8 compares the current-voltage (I-V) characteristics in the ON-states of the IGBTs according to the first and second embodiments and the conventional IGBT. The open circles are drawn on the curves only to indicate the correspondence between the curves and the respective IGBTs. The rated current density is defined to be 225 A/cm$^2$ and indicated by the solid line parallel to the horizontal axis of FIG. 8. First, a first IGBT and a comparative IGBT are fabricated in the same manner as in the working example 2. And, a second IGBT is fabricated in the same manner as in the working example 3. The collector current Ic and the collector-emitter voltage Vice are measured for the first and second IGBTs and for the comparative IGBT to investigate the electric characteristics of the IGBTs. The measurement methods are the same with those in the working example 2.

As the results described in FIG. 8 indicate, the ON-voltages at the rated current density of the first and second IGBTs tend to lower as compared with the ON-voltage of the conventional IGBT. Especially, the ON-voltage lowering of about 0.1 V at the rated current is confirmed in the second IGBT. The ON-voltage is the voltage drop between the collector and emitter necessary to make the rated current or the current of the rated current density flow. The ON-voltage is reduced in the second IGBT due to the IE effect enhanced by dummy trench 8. In other words, by arranging two dummy trenches 8, the distance between dummy trench 8 and gate trench 7 in mesa region 18 or the distance between adjacent dummy trenches 8 is shortened. As a result, the IE effect is improved, since the substantial width of mesa region 18 becomes narrow.

Working Example 5

Figure 9:
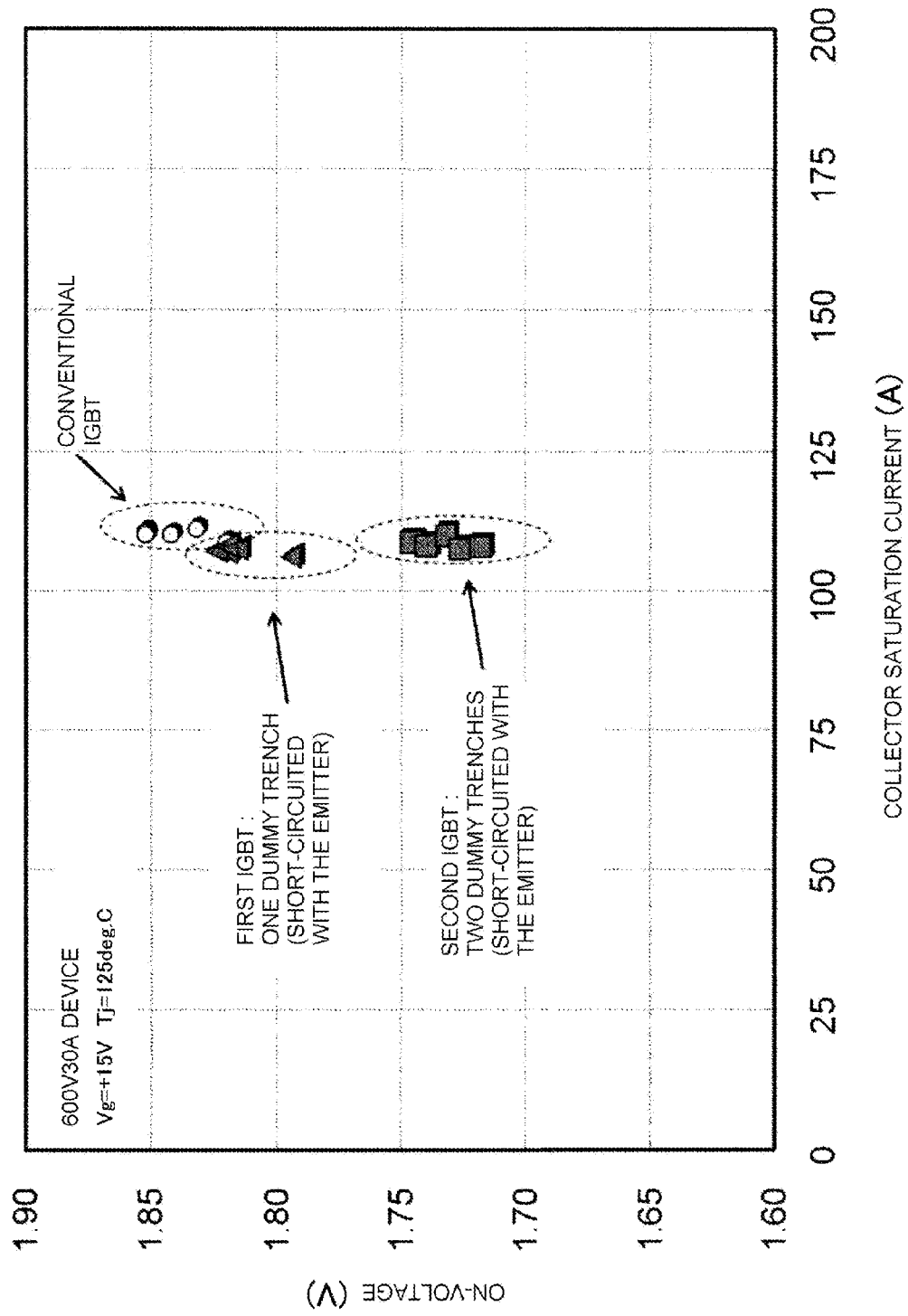
FIG. 9 is a graph describing the electric characteristics of the semiconductor devices for a working example 5.

FIG. 9 is a graph describing the electric characteristics of the semiconductor devices for a working example 5. FIG. 9 is a graph that compares the correlation between the saturation current value, at which the collector current Ic saturates, and the ON-voltage described in FIG. 8 for the IGBTs according to the first and second embodiments and for the conventional IGBT in the respective ON-states. If the gate voltage $V_{GE}$ is set at a certain value and the collector current Ic is made to flow until the ON-voltage becomes high enough to exceed 100 V to the higher side, the collector current Ic will saturate at a certain value due to the well-known current saturation effect in the MOS gate. The saturation current value is the current value, at which the collector current Ic saturates.

First, a first IGBT and a comparative IGBT are fabricated in the same manner as in the working example 2. A second IGBT is fabricated in the same manner as in the working example 3. The ON-voltage and the collector saturation current are measured for the first and second IGBTs and for the comparative IGBT and the electric characteristics of the IGBTs are investigated. Generally, there exists a tradeoff relation between the ON-voltage at the rated current density and the saturation current. If the channel density per a unit area (or the density of unit cells, each including a MOS gate, in the chip surface) is increased, the saturation current value will increase, although the ON-voltage will lower. The saturation current value relates strongly to the short-circuit withstanding capability described later. As the saturation current value is smaller, the short-circuit withstanding capability is higher preferably.

The results described in FIG. 9 indicate that the first IGBT facilitates reducing the ON-voltage by 0.03 V in average as compared with the conventional IGBT. The second IGBT including two dummy trenches 8 reduces the ON-voltage by 0.1 V, although the saturation current thereof is the same with the saturation current of the first IGBT or the conventional IGBT. In other words, by employing the structures according to the invention (first and second IGBTs), it becomes possible to reduce the ON-voltage without compensation for the saturation current increase. Due to the dummy trench formation according to the invention, the IE effect is enhanced without increasing the channel density described above.

Working Example 6

Figure 10:
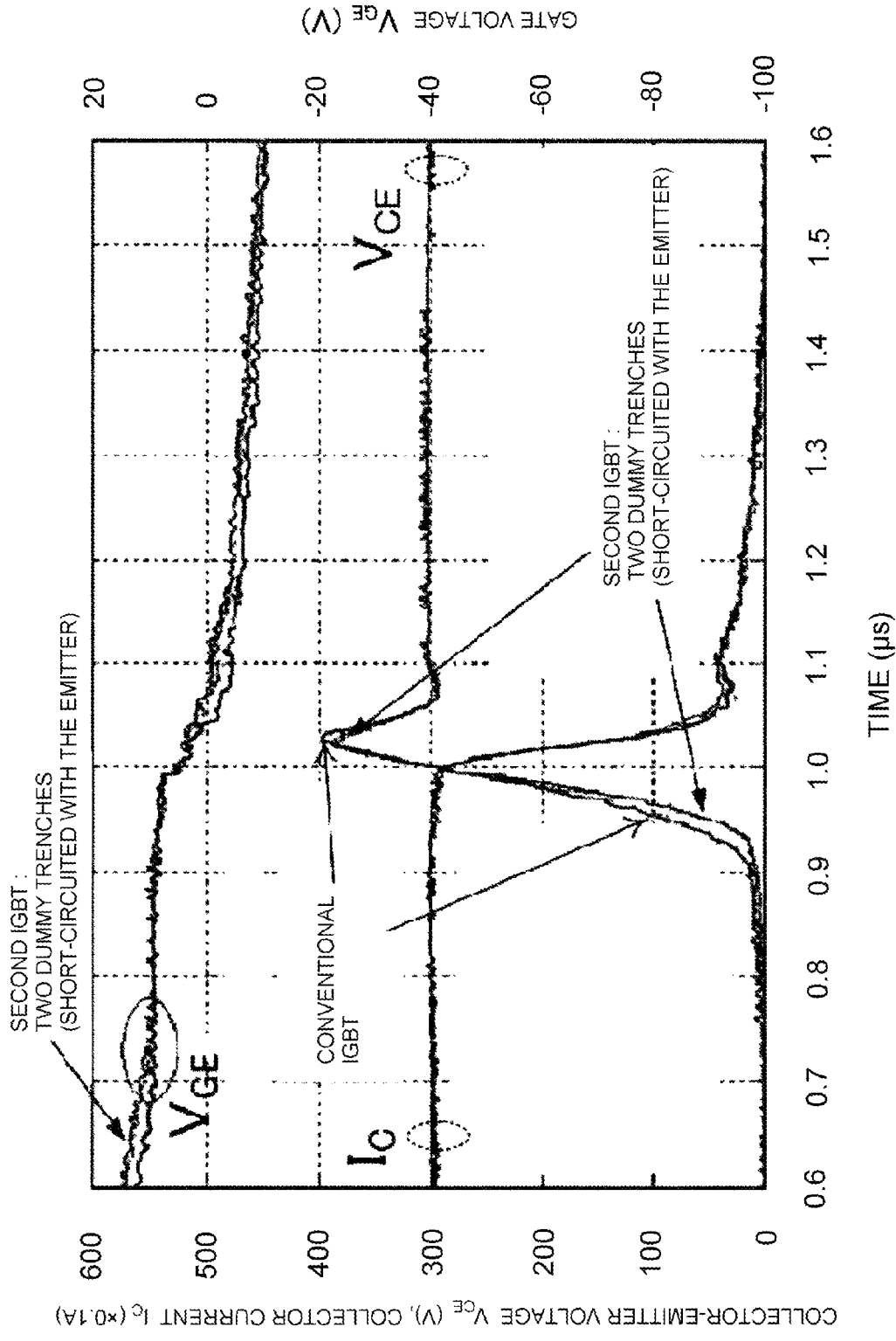
FIG. 10 is a graph describing the electric characteristics of the semiconductor devices for a working example 6.

FIG. 10 is a graph describing the electric characteristics of the semiconductor devices for a working example 6. FIG. 10 compares the turnoff waveforms of the IGBT according to the second embodiment and the conventional IGBT. In the same manner as in the working example 3, a second IGBT is fabricated. In the same manner as in the working example 2, a comparative IGBT is fabricated. Using the switching evaluation circuit described later, the collector current Ic, the collector-emitter voltage $V_{CE}$, and the gate voltage $V_{GE}$ are measured for the second IGBT and the comparative IGBT to investigate the electric characteristics thereof. Then, the switching evaluation circuit will be described below.

Figure 30:
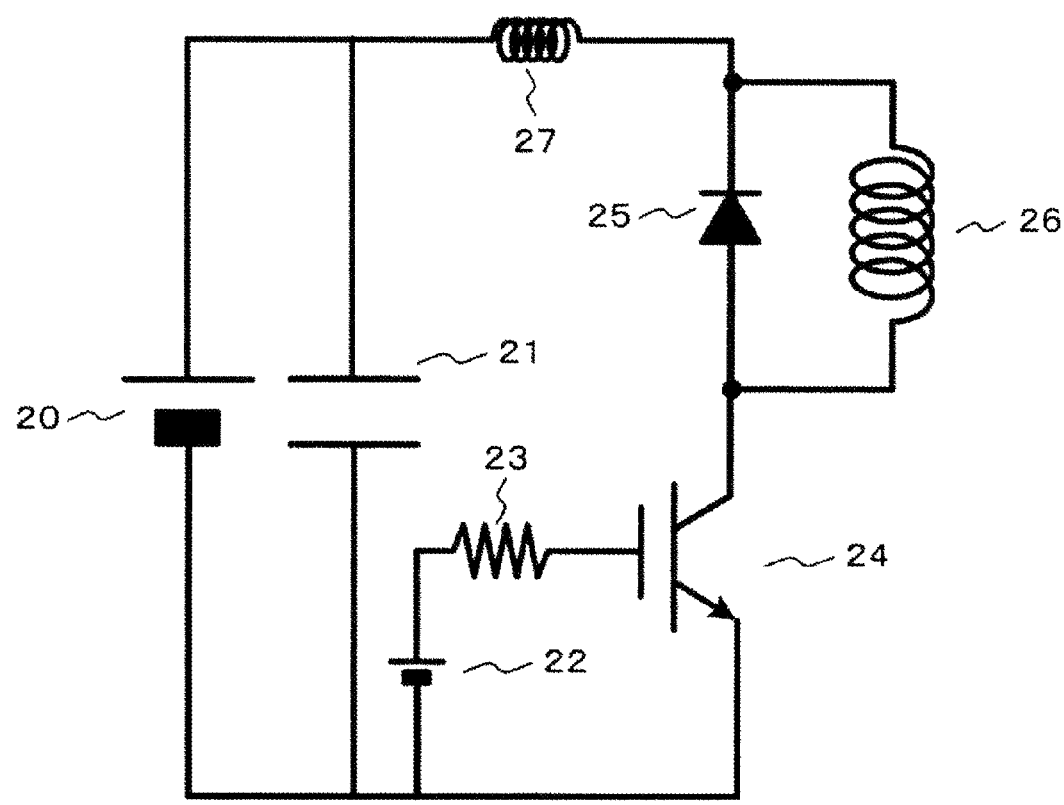
FIG. 30 is a switching evaluation circuit for evaluating the semiconductor devices according to the embodiments of the invention.

FIG. 30 is a switching evaluation circuit for evaluating the semiconductor devices according to the embodiments of the invention. FIG. 30 shows the switching test circuit for testing the turnoff or the turn-on described later. The circuit configuration shown in FIG. 30 is a single-phase inductive load circuit. Capacitor 21 is connected in parallel to a DC power supply 20. IGBT 24 and freewheel diode (FWD) 25 connected to the high voltage side of IGBT 24 are connected in parallel to capacitor 21. Inductive load 26 is connected in parallel to FWD 25. Inductive load 26 corresponds to a three-phase AC motor in a practical apparatus such as an inverter. Typically, inductive load 26 is from 0.1 mH to 1 mH. A pulse voltage of ±15 V is fed to IGBT 24 from gate driving power supply 22 via gate resistance 23 to control the ON and OFF of IGBT 24. Although there exists floating inductance 27 between 10 nH and 300 nH in the circuit itself, floating inductance 27 is described in the upper part of the circuit for the sake of convenience. The collector current for turning-off (hereinafter referred to as the "turnoff current") is 30 A (corresponding to the rated current density of 200 A/cm$^2$), the turnoff gate resistance is 75Ω, the gate voltage is ±15 V, and the measuring temperature is 125° C. The power supply voltage $V_{CC}$ is set at 300 V, half the rated voltage.

As the results described in FIG. 10 indicate, the delay time is shortened for 100 ns in the second IGBT as compared with the delay time caused in the conventional IGBT. (The delay time is a period of time, for which the gate voltage $V_{GE}$ shows a certain value, from the time point, at which the gate voltage $V_{GE}$ that has started lowering shows the certain value. On the $V_{GE}$ waveform in FIG. 10, the delay time is from the time point of about 0.7 μs to the time point of 0.9 μs.) The results described in FIG. 10 also indicate that the changing rate dV/dt of the collector-emitter voltage $V_{CE}$ at the rising thereof is increased. As a result, the turnoff loss is reduced by about 10%. The delay time becomes short due to the Miller capacitance reduction. It is also confirmed that the surge voltage (the maximum $V_{CE}$ value) lowers.

Working Example 7

Figure 11:
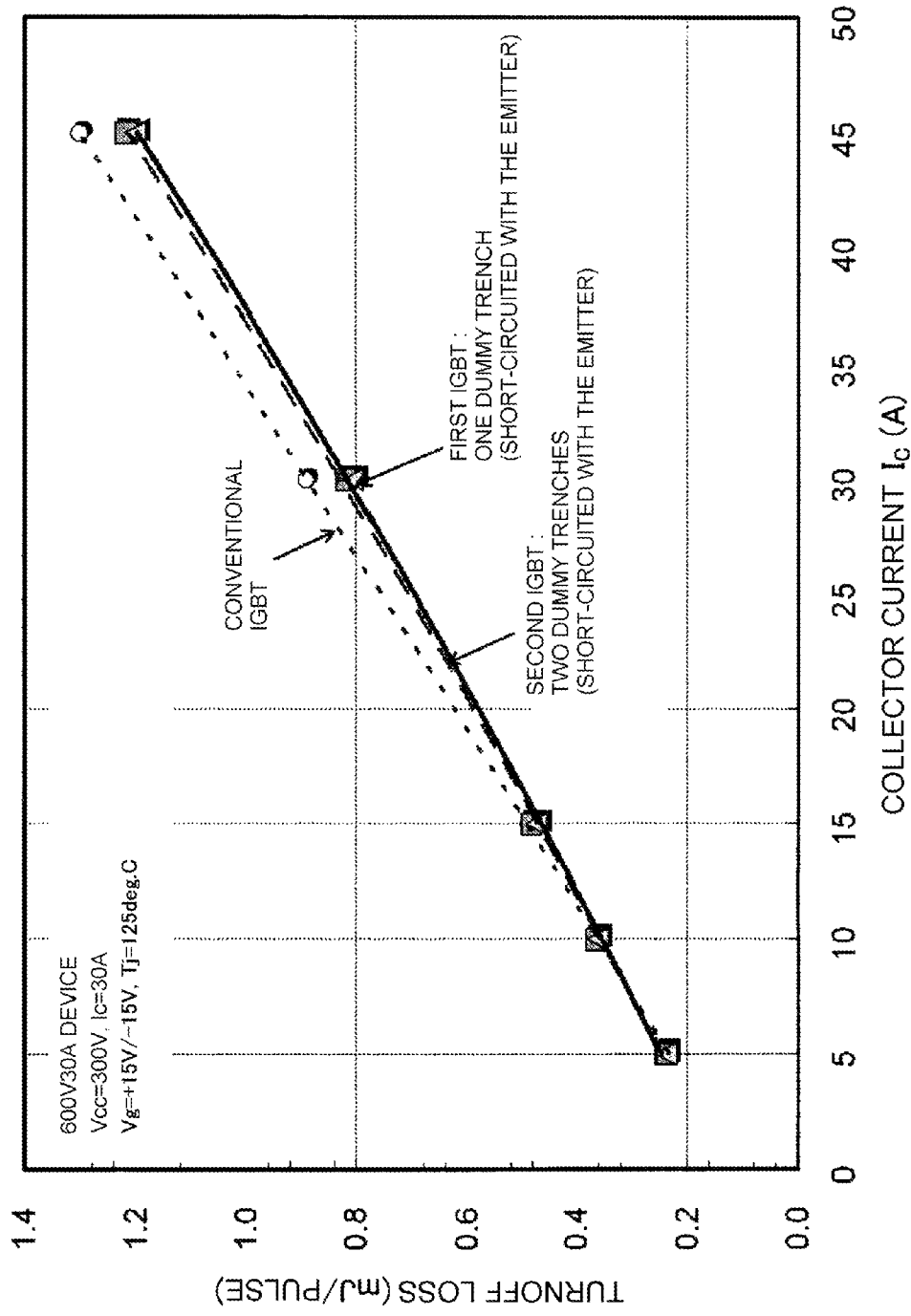
FIG. 11 is a graph describing the electric characteristics of the semiconductor devices for a working example 7.

FIG. 11 is a graph describing the electric characteristics of the semiconductor devices for a working example 7. FIG. 11 is a graph that describes the relation between the turnoff current and the turnoff loss under the switching conditions, under which the turnoff waveforms shown in FIG. 10 are obtained for the first and second IGBTs and for the conventional IGBT. First, a first IGBT and a comparative IGBT are fabricated in the same manner as in the working example 2. And, the second IGBT is fabricated in the same manner as in the working example 3. The turnoff loss and the collector current Ic are measured for the first and second IGBTs and for the comparative IGBT to investigate the electric characteristics of the IGBTs.

The turnoff loss is defined as the value obtained by integrating the product of the collector-emitter voltage $V_{CE}$ and the collector current $I_C$ (electric power loss) over the period from the time point, at which the gate voltage $V_{GE}$ starts reducing based on the OFF-signal fed to the gate, to the time point, at which the collector current $I_C$ becomes zero. (The product is referred to as the "energy loss" and the period as the "one pulse".) Generally, the turnoff loss is proportional to the turnoff current almost linearly.

As the results described in FIG. 11 indicate, the first and second IGBTs facilitate obtaining a turnoff loss smaller than that of the conventional IGBT at the rated current or at a certain current larger than the rated current. A smaller turnoff loss is obtained, since the Miller capacitance Cgc is reduced by the provision of the dummy trench according to the invention and, as a result, the delay time at the time of turnoff determined by the Miller capacitance is shortened. In other words, since the delay time is shortened, the turnoff time is shortened and the turnoff loss is reduced.

Working Example 8

Figure 12:
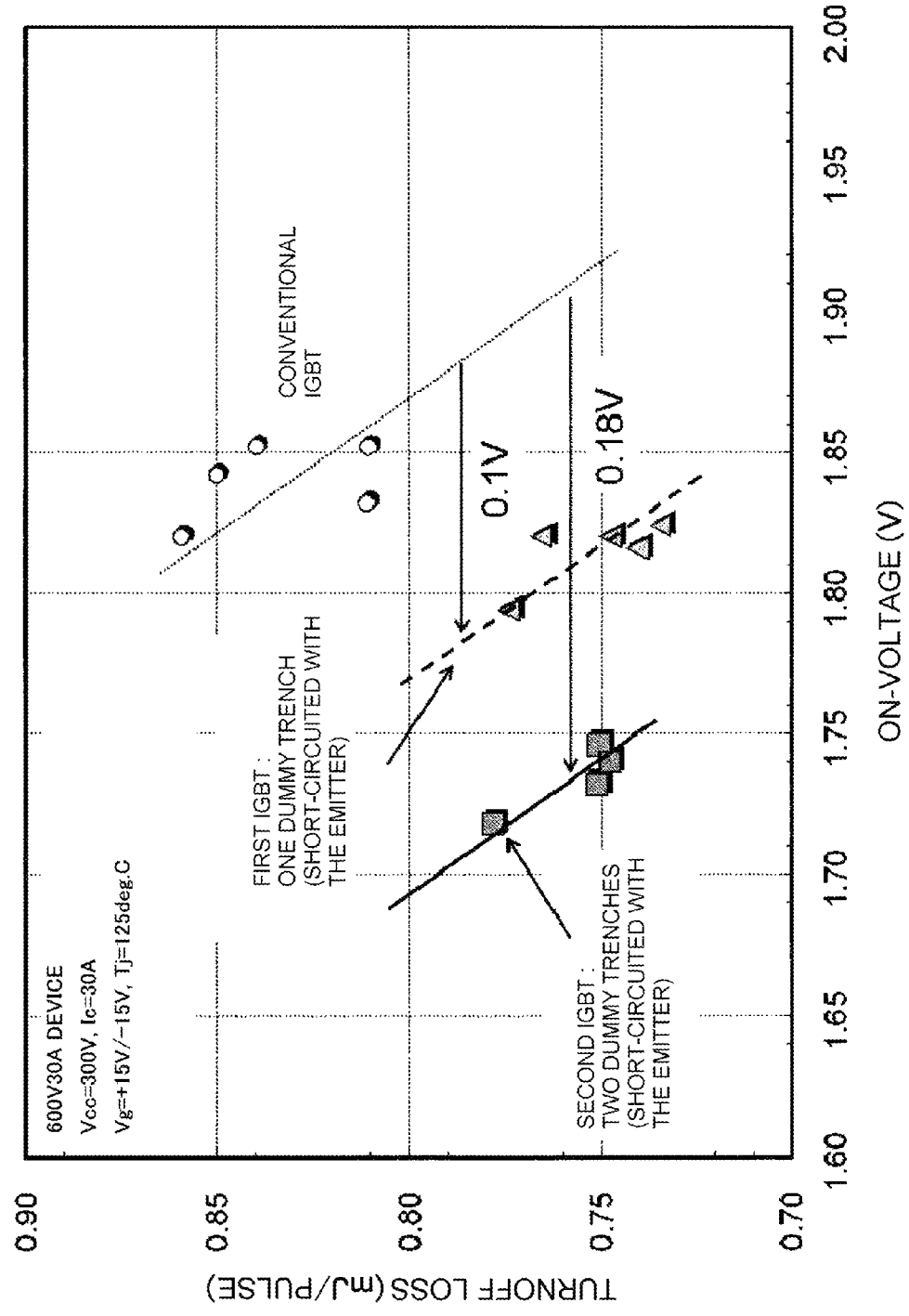
FIG. 12 is a graph describing the electric characteristics of the semiconductor devices for a working example 8.

FIG. 12 is a graph describing the electric characteristics of the semiconductor devices for a working example 8. FIG. 12 describes the relation between the ON-voltage and the turnoff loss of the IGBTs according to the first and second embodiments and the conventional IGBT. First, a first IGBT and a comparative IGBT are fabricated in the same manner as in the comparative example 2. A second IGBT is fabricated in the same manner as in the comparative example 3. The turnoff loss and the ON-voltage are measured for the first and second IGBTs and for the comparative IGBT to investigate the electric characteristics of the IGBTs.

Generally, there exists a tradeoff relation between the ON-voltage and the turnoff loss. For example, if the total impurity amount in the p-type collector layer is increased to improve the hole injection efficiency, the ON-voltage lowers. However, since the injected hole concentration increases, the turnoff time is elongated and, as a result, the turnoff loss increases.

As the results described in FIG. 12 indicate, the turnoff loss in the first IGBT (the dummy polysilicon therein is short-circuited with the emitter electrode) is reduced by 10% or more as compared with that of the conventional IGBT. If the decrement of the turnoff loss is converted to the ON-voltage, it will be obvious that the ON-voltage is reduced by 0.10 V or more. In the second IGBT (the dummy polysilicon therein is short-circuited with the emitter electrode), the ON-voltage reduction of 0.18 V is achieved. In other words, the tradeoff relation between the ON-voltage and the turnoff loss is improved dramatically according to the invention without compensation for the saturation current increase described above. The reason for this is as follows. By forming a dummy trench or dummy trenches according to the invention, the Miller capacitance Cgc is reduced and, as a result, the delay time caused in the turnoff and determined by the Miller capacitance is shortened. As a result, the turnoff time is shortened and the turnoff loss is reduced.

Working Example 9

Figure 13:
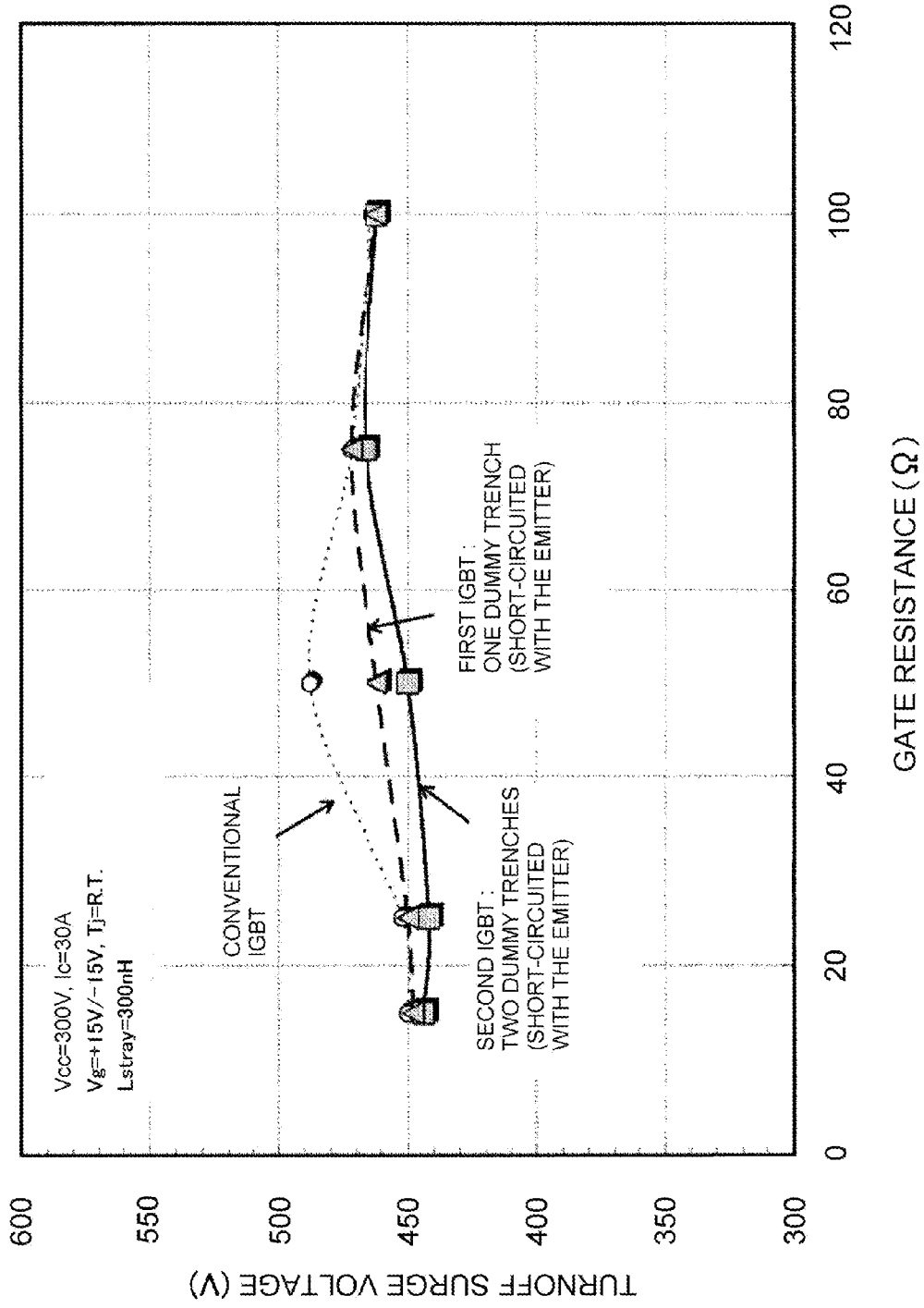
FIG. 13 is a graph describing the electric characteristics of the semiconductor devices for a working example 9.

FIG. 13 is a graph describing the electric characteristics of the semiconductor devices for a working example 9. FIG. 13 describes the relation between the gate resistance at time of turnoff and the surge voltage at time of turnoff in the IGBTs according to the first and second embodiments and in the conventional IGBT. First, a first IGBT and a comparative IGBT are fabricated in the same manner as in the working example 2. A second IGBT is fabricated in the same manner as in the working example 3. The turnoff surge voltage and the gate resistance are measured for the first and second IGBTs and for the comparative IGBT to investigate the electric characteristics of the IGBTs.

As the results described in FIG. 13 indicate, the turnoff surge voltage in the second IGBT is smaller than that in the conventional IGBT also in the working example 9. One knows from FIG. 13 that the effect (the surge voltage difference between the first or second IGBT and the conventional IGBT) is large at the gate resistance of 50Ω. In other words, the maximum value of the surge voltages in the first and second IGBTs is on the high gate resistance side and the absolute value thereof is low. The reason is as follows. Due to the provision of dummy trench 8, the Miller capacitance lowers and the time constant, at which the gate voltage $V_{GE}$ lowers at the time of turnoff, (Cgc×Rg, here Rg is gate resistance.) reduces. Therefore, it is considered that the gate turnoff is equivalent to the gate drive conducted through relatively low gate resistance.

Working Example 10

Figure 14:
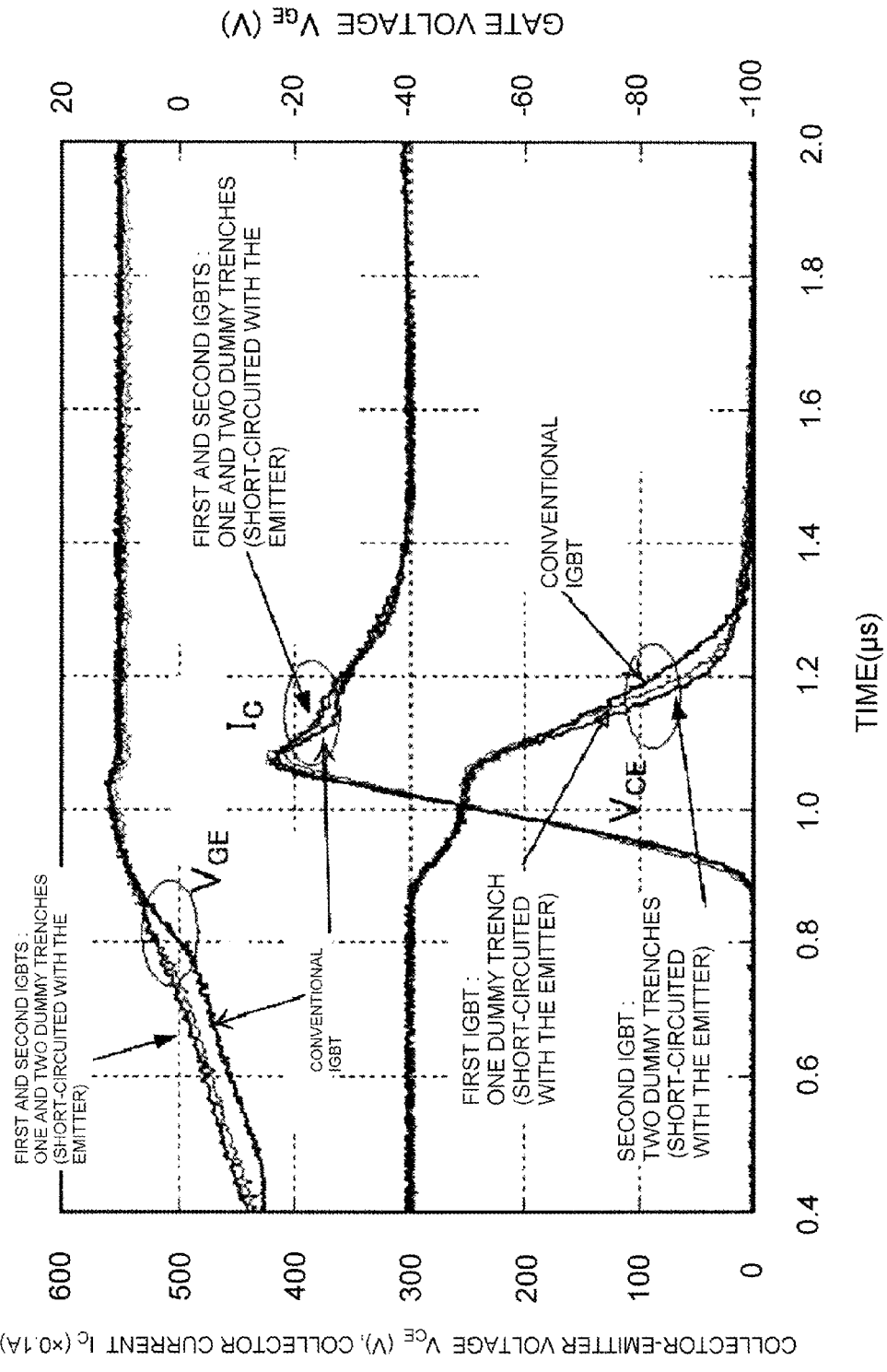
FIG. 14 is a graph describing the electric characteristics of the semiconductor devices for a working example 10.

FIG. 14 is a graph describing the electric characteristics of the semiconductor devices for a working example 10. FIG. 14 compares the turn-on waveforms of the IGBTs according to the first and second embodiments and the conventional IGBT. First, a first IGBT and a comparative IGBT are fabricated in the same manner as in the working example 2. A second IGBT is fabricated in the same manner as in the working example 3. The collector current $I_C$, the collector-emitter voltage $V_{CE}$, and the gate voltage $V_{GE}$ are measured for the first and second IGBTs and for the comparative IGBT to investigate the electric characteristics of the IGBTs. The measuring methods are the same with those in the comparative example 6.

As the results described in FIG. 14 indicate, the gate voltage $V_{GE}$ increases rapidly at the time of 0.8 μs on the gate voltage $V_{GE}$ waveform of the conventional IGBT increasing from −15 V. In contrast, the gate voltages $V_{GE}$ of the first and second IGBTs increase smoothly without causing any abrupt change. In the period, in which the collector-emitter voltage $V_{CE}$ reduces, (from 1.1 μs to 1.3 μs), the magnitudes (absolute values) of the voltage change rates dV/dt of the first and second IGBTs are larger than that of the conventional IGBT, indicating that the collector-emitter voltages $V_{CE}$ of the first and second IGBTs reduce rapidly. One of the reasons for obtaining the effect described above is that the rapid charging and discharging to and from the gate caused at the time of turn-on by the Miller capacitance are suppressed, since the Miller capacitance is lowered by the provision of dummy trench 8. The other reason is that the depletion layer width is reduced rapidly due to the Miller capacitance lowering similarly and it is possible for the depletion layer to vanish.

After the collector current Ic shifts to the reducing side over the maximum value thereof, the magnitudes (absolute value) of the voltage change rates dV/dt of the first and second IGBTs reduce. The reason for this is that the Miller capacitance reduction in an IGBT makes an FWD on the arm facing in opposite to the IGBT recover softly.

Working Example 11

Figure 15:
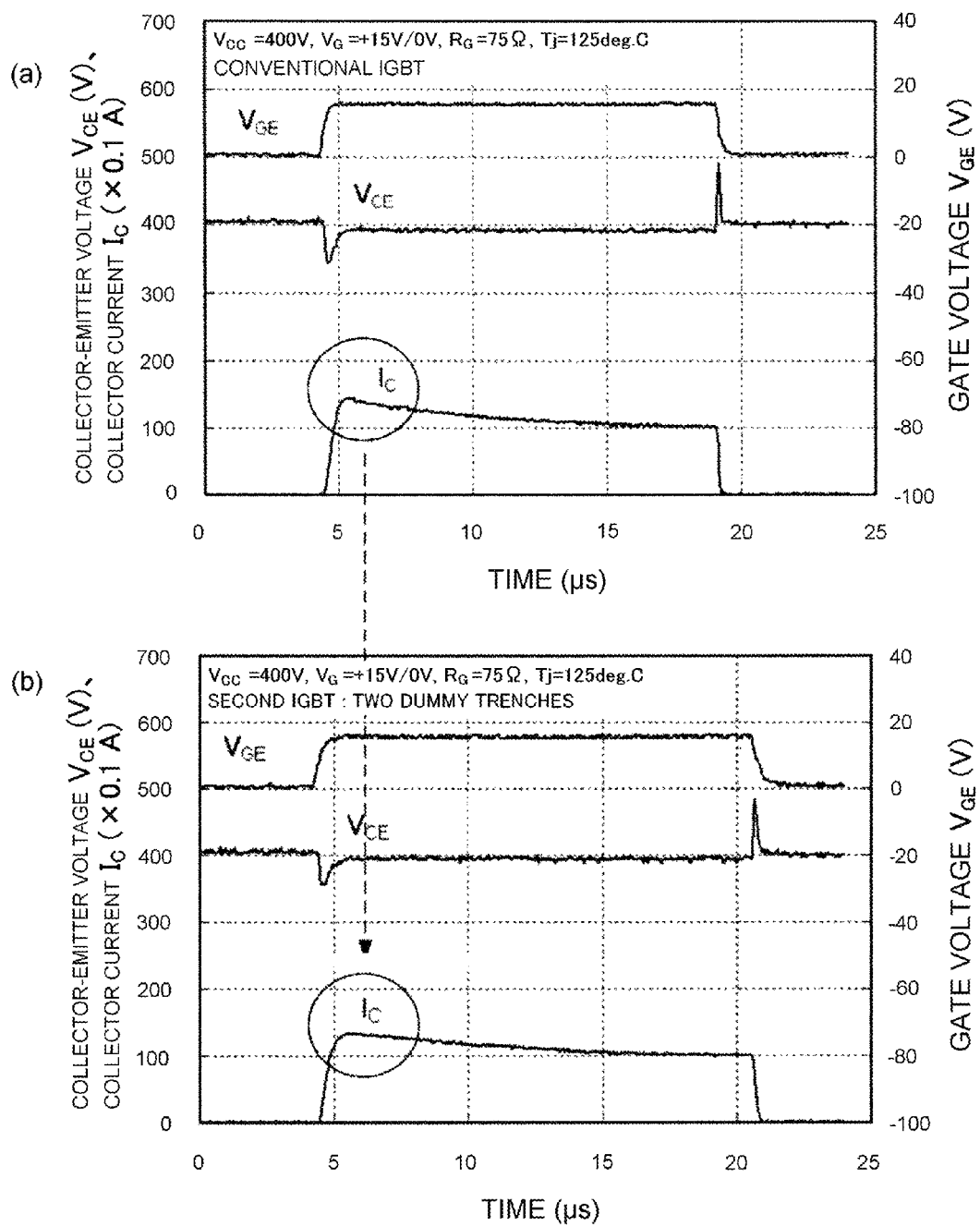
FIG. 15 is a pair of graphs describing the electric characteristics of the semiconductor devices for a working example 11.

FIG. 15 is a pair of graphs describing the electric characteristics of the semiconductor devices for a working example 11. FIG. 15 compares the short-circuit waveform of the conventional IGBT described in (a) of FIG. 15 and the short-circuit waveform of the IGBT according to the second embodiment described in (b) of FIG. 15 with each other. First, a second IGBT is fabricated in the same manner as in the working example 3. A comparative IGBT is fabricated in the same manner as in the working example 2. The collector current $I_C$, the collector-emitter voltage $V_{CE}$, and the gate voltage $V_{GE}$ are measured for the second IGBT and for the comparative IGBT to investigate the electric characteristics of the IGBTs. The measuring methods are the same with those in the comparative example 6.

As the results described in FIG. 15 indicate, the turn-on di/dt of the second IGBT is smaller that of the conventional IGBT. As a result, although the static saturation currents are almost equal to each other as shown in FIG. 9, the maximum value of the collector current Imax lowers. The reason for this is considered as follows. The rise (minute increase) of the gate voltage caused by the displacement current via the Miller capacitance Cres is suppressed, since the input capacitance Cies increases by the formation of dummy trench 8 and since the Miller capacitance Cres is small. The reduction of the maximum value Imax of the collector current caused by the Miller capacitance reduction is preferable from the view points of reducing the maximum collector current caused by short-circuiting and improving the short-circuit withstanding capability.

Working Example 12

Figure 16:
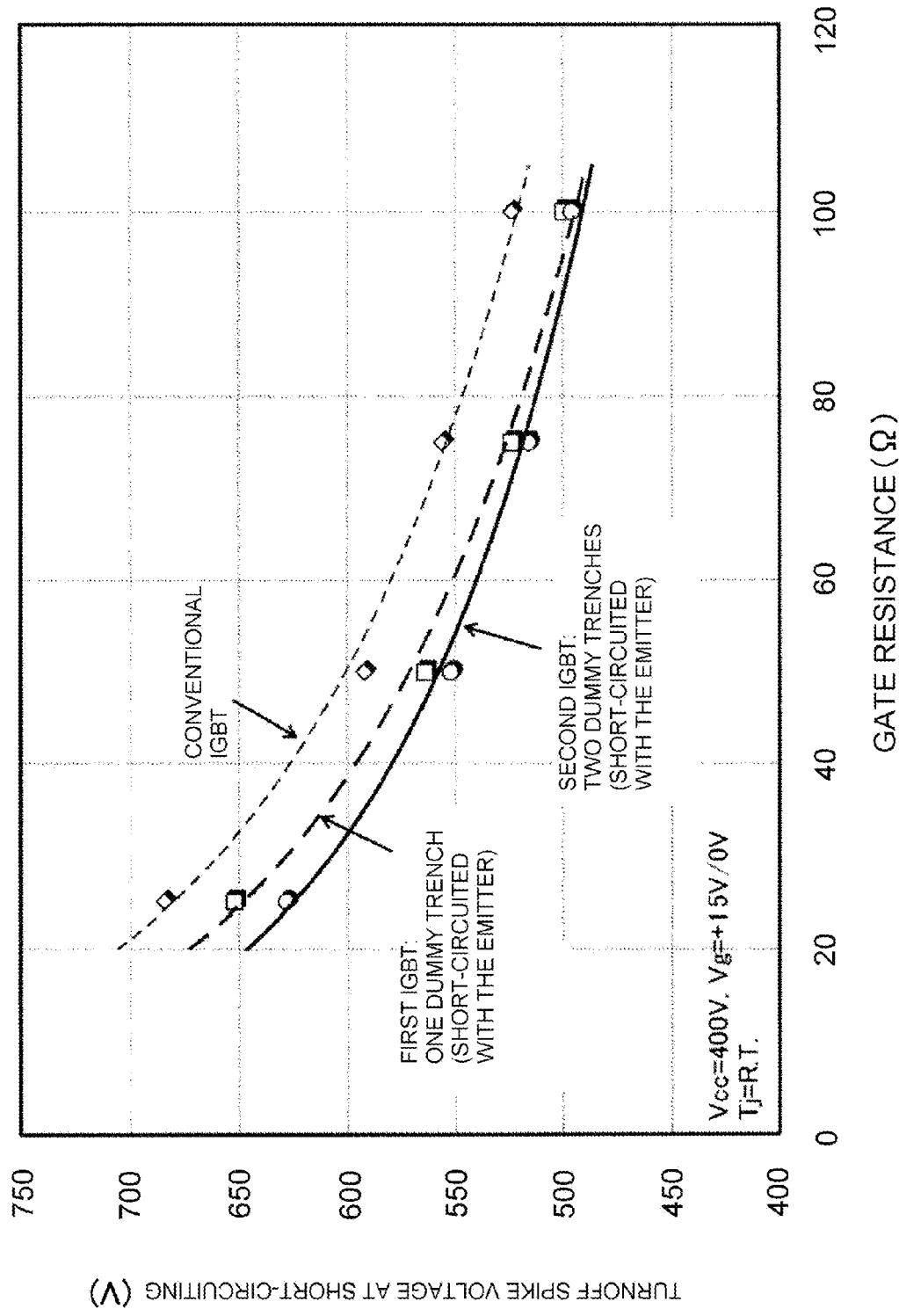
FIG. 16 is a graph describing the electric characteristics of the semiconductor devices for a working example 12.

FIG. 16 is a graph describing the electric characteristics of the semiconductor devices for a working example 12. FIG. 16 compares the relations between the turnoff spike voltage (the maximum value of the surge voltage between the collector and emitter) waveform at the time of short-circuit and the gate resistance at the time of turnoff of the IGBTs according to the first and second embodiments and the conventional IGBT. First, a first IGBT and a comparative IGBT are fabricated in the same manner as in the working example 2. A second IGBT is fabricated in the same manner as in the working example 3. The turnoff spike voltage at the time of short-circuit and the gate resistance are measured for the first and second IGBTs and for the comparative IGBT to investigate the electric characteristics of the IGBTs.

As the results described in FIG. 16 indicate, the surge voltage values at the time of short-circuit interruption of the first and second IGBTs reduce and the curves on the graph shift to the direction of gate resistance reduction, although there exists a tradeoff relation between the turnoff spike voltage and the gate resistance at the time of short-circuit. The reason for this is considered that the input capacitance becomes large (the Miller capacitance becomes small) by the employment of dummy trench 8.

As described above, the IGBT according to the second embodiment exhibits the effects the same with the effects which the IGBT according to the first embodiment exhibits. By forming a plurality of dummy trench 8, the distance between dummy trench 8 and gate trench 7 or the distance between adjacent dummy trenches 8 is reduced. Since the effective width of the mesa region 18 is narrowed, the IE effect is improved. Thus, a semiconductor device, the ON-voltage thereof is low is obtained.

Now the semiconductor devices according to the other embodiments of the invention will be described below.

Third Embodiment

Figure 17:
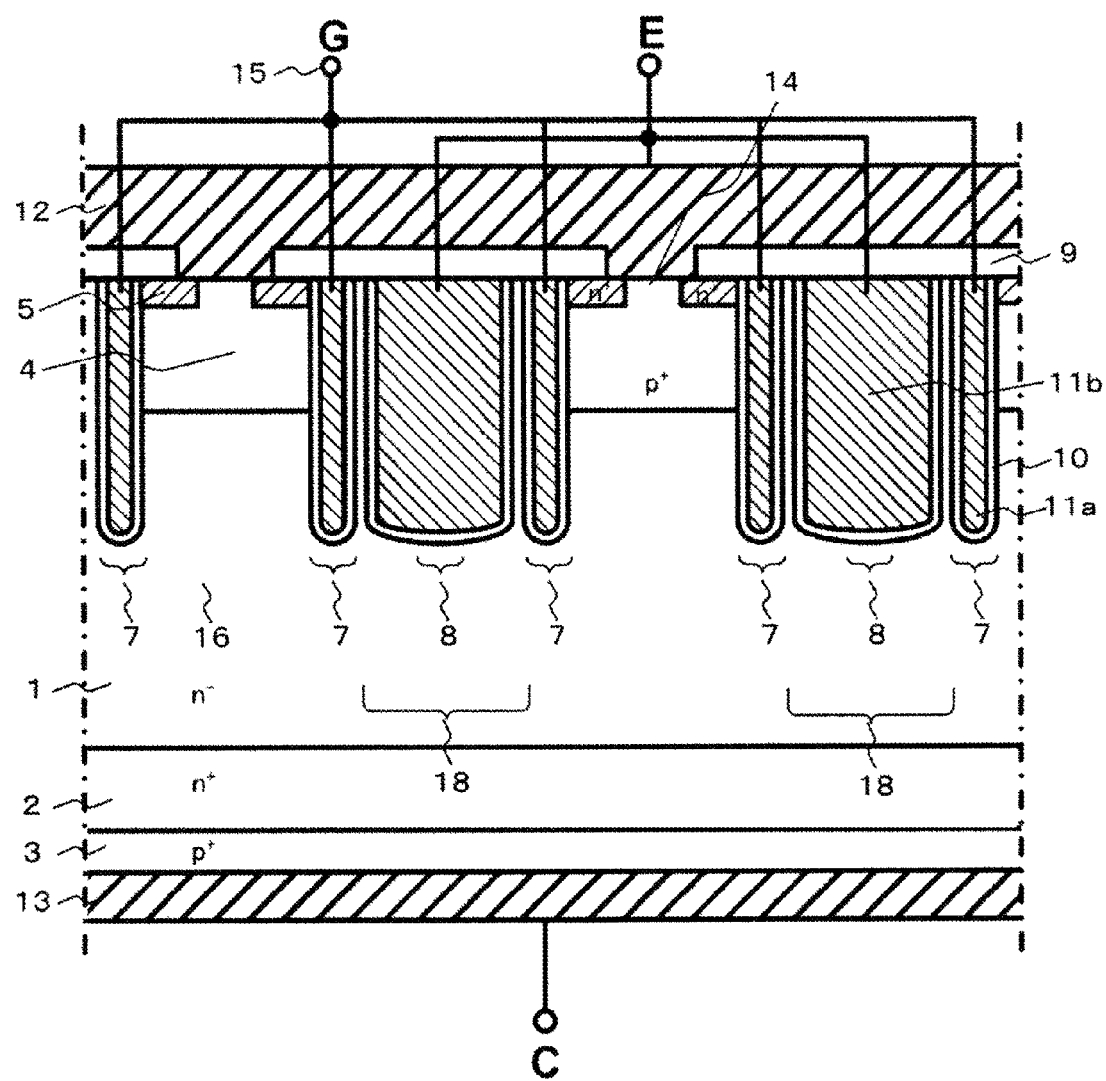
FIG. 17 is the cross sectional view of a semiconductor device according to a third embodiment of the invention.

Now a semiconductor device according to a third embodiment of the invention will be described with reference to FIG. 17. FIG. 17 is the cross sectional view of the semiconductor device according to the third embodiment. The semiconductor device according to the third embodiment is different from the semiconductor device according to the first embodiment in that the width of dummy trench 8 in mesa region 18 is wide in the semiconductor device according to the third embodiment. According to the third embodiment, the number of dummy trench 8 is reduced to one but it is possible to obtain the Miller capacitance reduction effect, the same with the effect, which the semiconductor device including two dummy trenches 8 exhibits. Since the area, in which emitter electrode 12 and dummy polysilicon 11b are in contact with each other, is wide in setting emitter electrode 12 and dummy polysilicon 11b at the same potential, it is possible to set the contact resistance between emitter electrode 12 and dummy polysilicon 11b to be small sufficiently.

As described above, the semiconductor device according to the third embodiment exhibits the effects, the same with the effects, which the semiconductor device according to the first embodiment exhibits.

Fourth Embodiment

Figure 18:
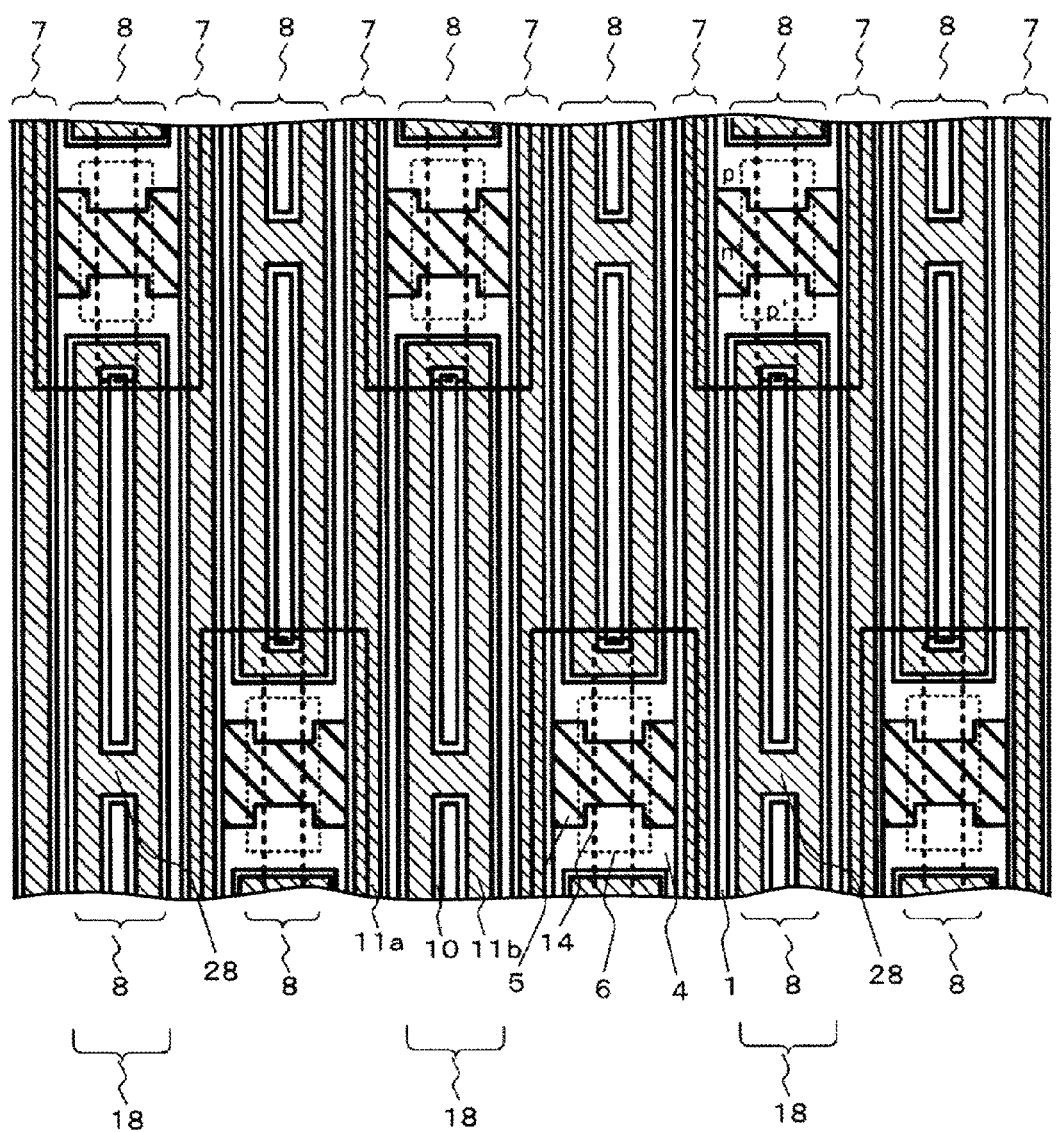
FIG. 18 is the top plan view of a semiconductor device according to a fourth embodiment of the invention.

Now a semiconductor device according to a fourth embodiment of the invention will be described with reference to FIG. 18. FIG. 18 is the top plan view of the semiconductor device according to the fourth embodiment. The semiconductor device according to the fourth embodiment is different from the semiconductor device according to the second embodiment as described below. Two adjacent dummy trenches 8 formed in mesa region 18 are connected to each other not only in the distal end portions thereof but in middle portions 28. Therefore, dummy polysilicon 11b is connected to adjacent dummy polysilicon 11b in middle portions 28.

Since dummy polysilicon 11b is polycrystalline silicon doped heavily with phosphorus and such an impurity, dummy polysilicon 11b exhibits a sufficiently low resistance value. However, if compared with aluminum and such a metal, dummy polysilicon 11b exhibits a high resistance value. Therefore, when the collector-emitter voltage changes rapidly at the time of switching (at the instantaneous voltage change rate of around 10000 V/µs), a time lag is caused sometimes in the potential change in dummy polysilicon 11b.

For example, the potential in the vicinity of the middle portion farthest from the distal end portion of dummy trench 8, in contact with the emitter electrode, along the extending direction thereof is considered. It is assumed that variations are caused in the doping concentration (sheet resistance) between adjacent two dummy polysilicon 11b. If the rapid voltage change as described above is caused, the potential of one of two pieces of dummy polysilicon 11b, the sheet resistance thereof is higher, follows the rapid voltage change more slowly than the potential of dummy polysilicon 11b, the sheet resistance thereof is lower. Therefore, a potential difference is caused in the vicinity of the middle portion, unstabilizing the operations of the semiconductor device. By employing the structure according to the fourth embodiment, middle portions 28 of adjacent two dummy trenches 8 are set at the same potential and it becomes possible to prevent the operations of the semiconductor device from becoming unstable.

As described above, the semiconductor device according to the fourth embodiment exhibits the effects, the same with the effects, which the semiconductor devices according to the first and second embodiments exhibit.

Fifth Embodiment

Figure 19:
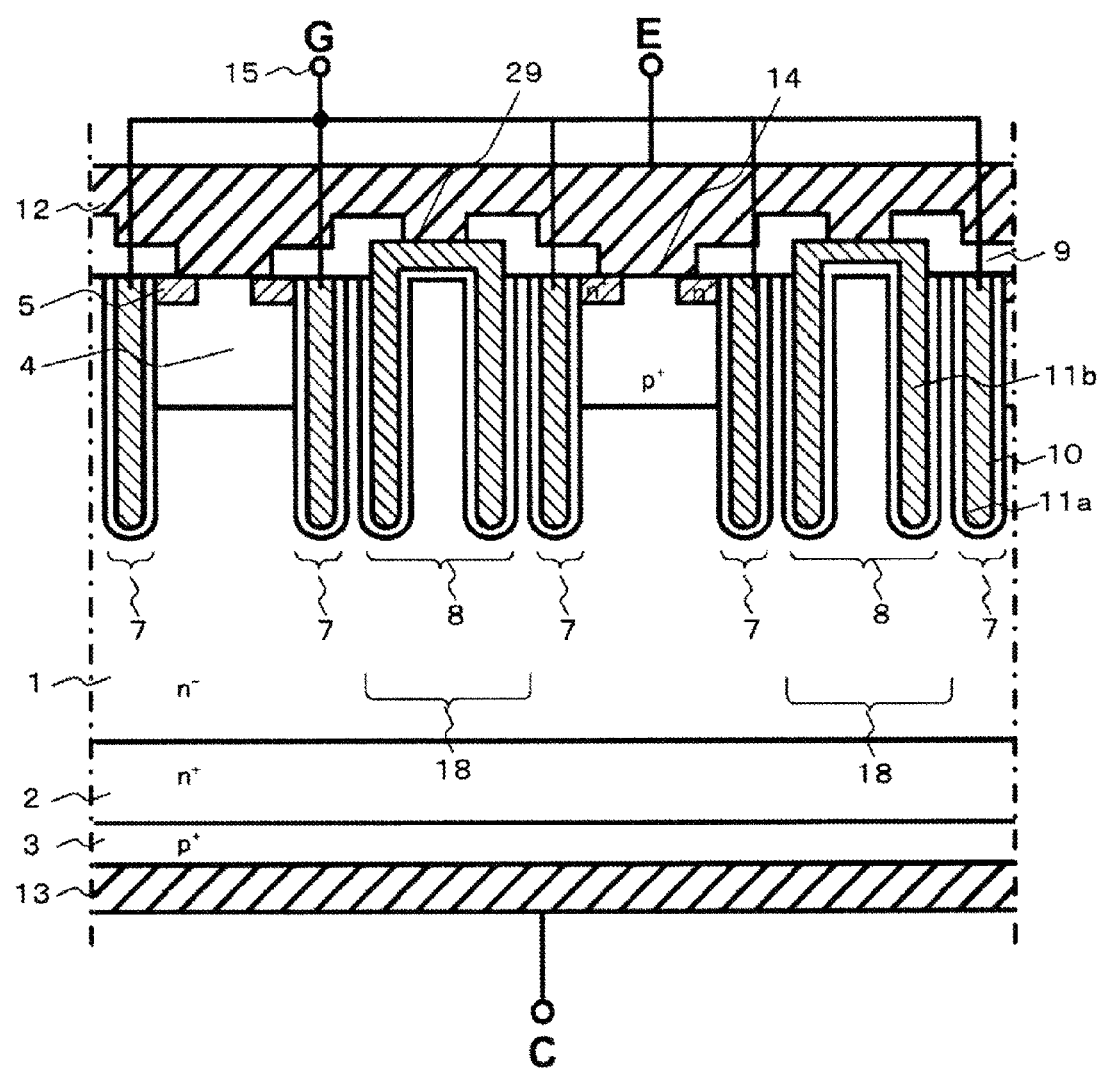
FIG. 19 is the cross sectional view of a semiconductor device according to a fifth embodiment of the invention.
Figure 20:
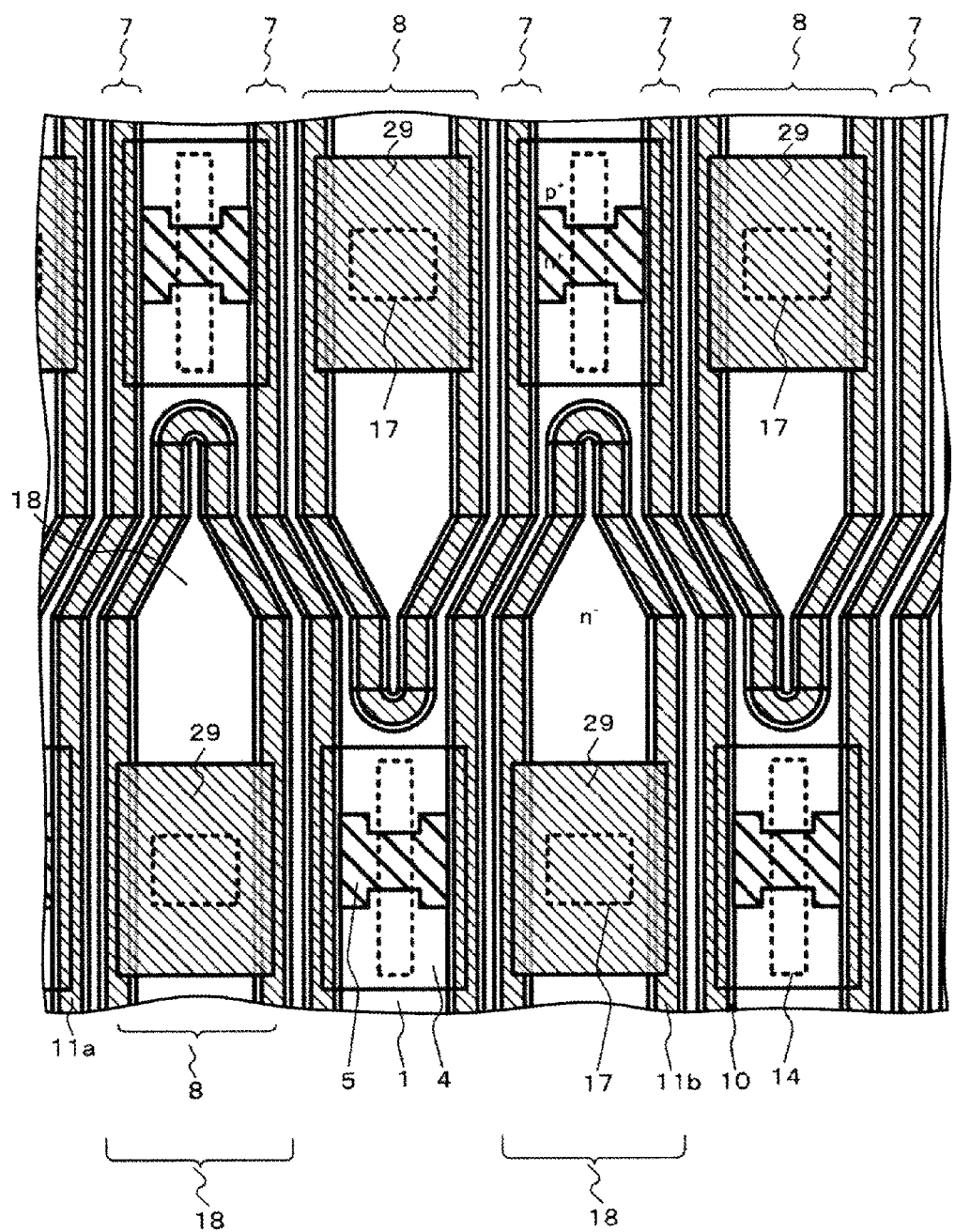
FIG. 20 is the top plan view of the IGBT shown in FIG. 19.

Now a semiconductor device according to a fifth embodiment of the invention will be described with reference to FIGS. 19 and 20. FIG. 19 is the cross sectional view of the semiconductor device according to the fifth embodiment. FIG. 20 is the top plan view of the IGBT shown in FIG. 19. The semiconductor device according to the fifth embodiment is different from the semiconductor device according to the second embodiment as described below. Dummy polysilicon 11b is extended over the upper surface of dummy trench 8 to form bridge portion 29 and to connect two pieces of dummy polysilicon 11b to each other in a shape of a bridge across mesa region 18. Polysilicon pad 17 (FIG. 20), that is an opening for bringing dummy polysilicon 11b and emitter electrode 12 into contact with each other, is formed in the upper surface of bridge portion 29.

It is preferable for bridge portion 29 of dummy polysilicon 11b and polysilicon pad 17 to have the respective planar patterns as described below. For example, the width of mesa region 18 in the vicinity of the middle portion thereof is widened as shown in FIG. 20 and bridge portion 29 of dummy polysilicon 11b is formed in the vicinity of the middle portion described above. Polysilicon pad 17 (opening) is formed in bridge portion 29. By employing the layout as described above, polysilicon pad 17 (opening) is sufficiently widened and, as a result, it is possible to bring dummy polysilicon 11b and emitter electrode 12 into contact each other via sufficiently low contact resistance.

As described above, the semiconductor device according to the fifth embodiment exhibits the effects, the same with the effects, which the semiconductor devices according to the first and second embodiments exhibit.

Sixth Embodiment

Figure 21:
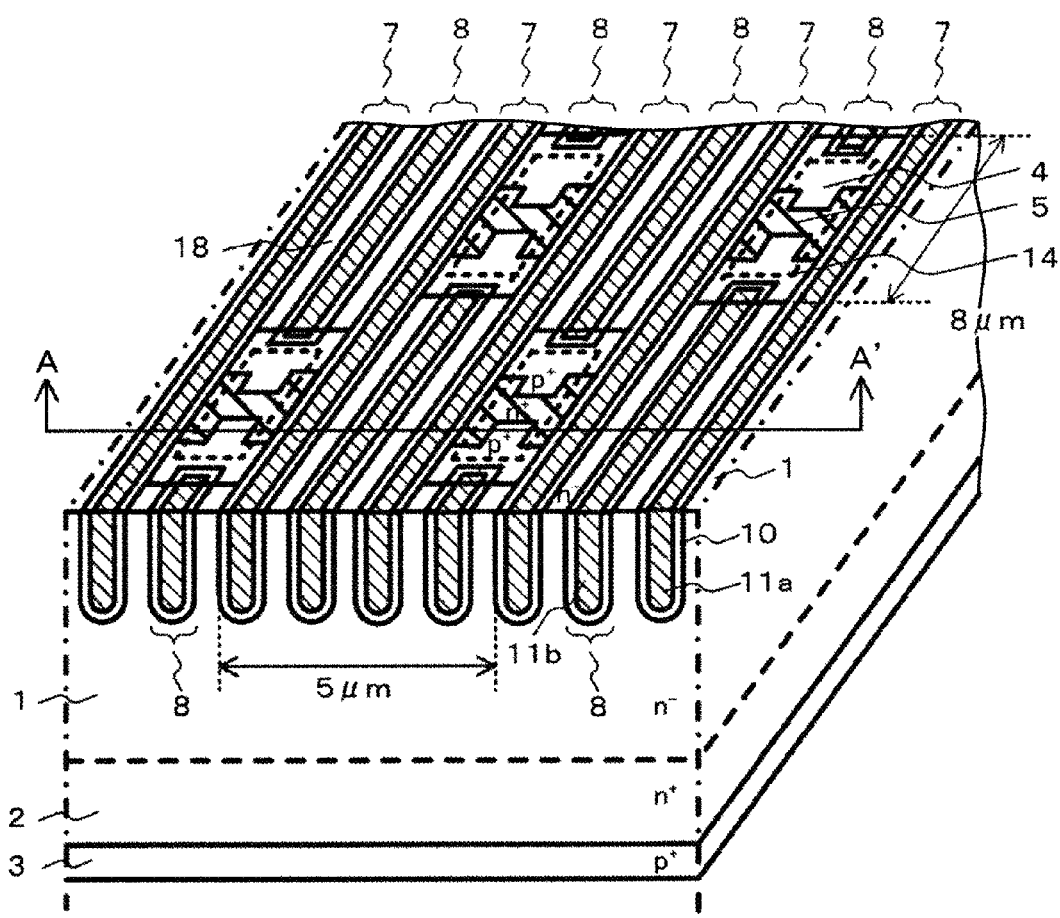
FIG. 21 is the oblique view of a semiconductor device according to a sixth embodiment of the invention.

Now a semiconductor device according to a sixth embodiment of the invention will be described with reference to FIG. 21. FIG. 21 is the oblique view of the semiconductor device according to the sixth embodiment. The semiconductor device according to the sixth embodiment is different from the semiconductor device according to the first embodiment as described below. The length, in the extending direction of gate trench 7, of contact opening 14 formed in the upper surface of p-type base layer 4 is shortened so that contact opening 14 may not be on the distal end portion of dummy trench 8 in the extending direction thereof. In other words, by bringing dummy polysilicon 11b not into contact with the emitter electrode, the dummy polysilicon 11b potential is made to float. When the dummy polysilicon 11b potential is made to float, the Miller capacitance is reduced to 75% of the Miller capacitance in the conventional IGBT, although not so much as compared with the case, in which dummy polysilicon 11b is connected to the emitter electrode.

Although not illustrated, the Miller capacitance is reduced to 66% of the Miller capacitance in the conventional IGBT by increasing the number of dummy trenches 8 to two. When the dummy polysilicon 11b potential is floating, it is not necessary to form contact opening 14 on the distal end portion of dummy trench 8. Therefore, the etching damage caused by opening a contact in interlayer insulator film 9 does not affect adversely gate oxide film 10 around dummy polysilicon 11b. Therefore, the finished shape from the distal end portion of dummy trench 8 in the extending direction thereof to the distal end portion of contact opening 14 is very excellent.

As described above, the semiconductor device according to the sixth embodiment exhibits the effects, the same with the effects, which the semiconductor device according to the first embodiment exhibits.

Seventh Embodiment

Figure 22:
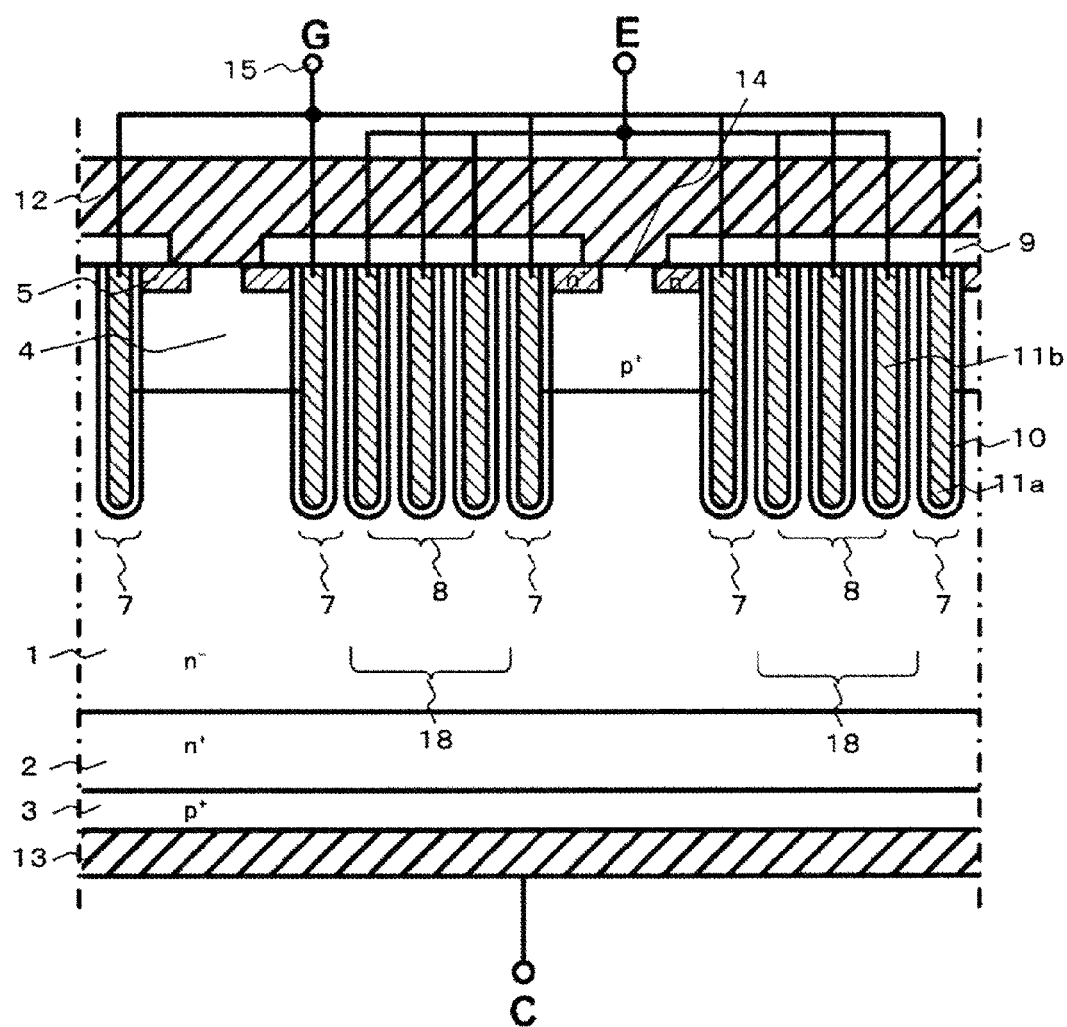
FIG. 22 is the cross sectional view of a semiconductor device according to a seventh embodiment of the invention.

Now a semiconductor device according to a seventh embodiment of the invention will be described with reference to FIG. 22. FIG. 22 is the cross sectional view of the semiconductor device according to the seventh embodiment. The semiconductor device according to the seventh embodiment is different from the semiconductor device according to the second embodiment in that three dummy trenches 8 are in mesa region 18. In other words, the number of dummy trenches 8 in mesa region 18 is not always limited to three. The number of dummy trenches 8 in mesa region 18 may be four or more preferably.

By setting mesa region 18 to be wider than p-type base layer 4, it is possible to encourage the carrier accumulation in the vicinity of mesa region 8 when the IGBT is electrically conductive. As a result, either one or both of the ON-voltage and the turn-on loss reduce, sine the tradeoff relation between the ON-voltage and the turnoff loss is improved. The dummy polysilicon 11b potential may be set at multiple values with no problem. For example, dummy polysilicon 11b in the central one of three dummy trenches 8 may be set at the gate electrode 15 potential. If dummy polysilicon 11b in all the dummy trenches 8 is connected to emitter electrode 12, although not illustrated, it is possible to further reduce the Miller capacitance.

As described above, the semiconductor device according to the seventh embodiment exhibits the effects, the same with the effects, which the semiconductor devices according to the first and second embodiments exhibit.

Eighth Embodiment

Figure 24:
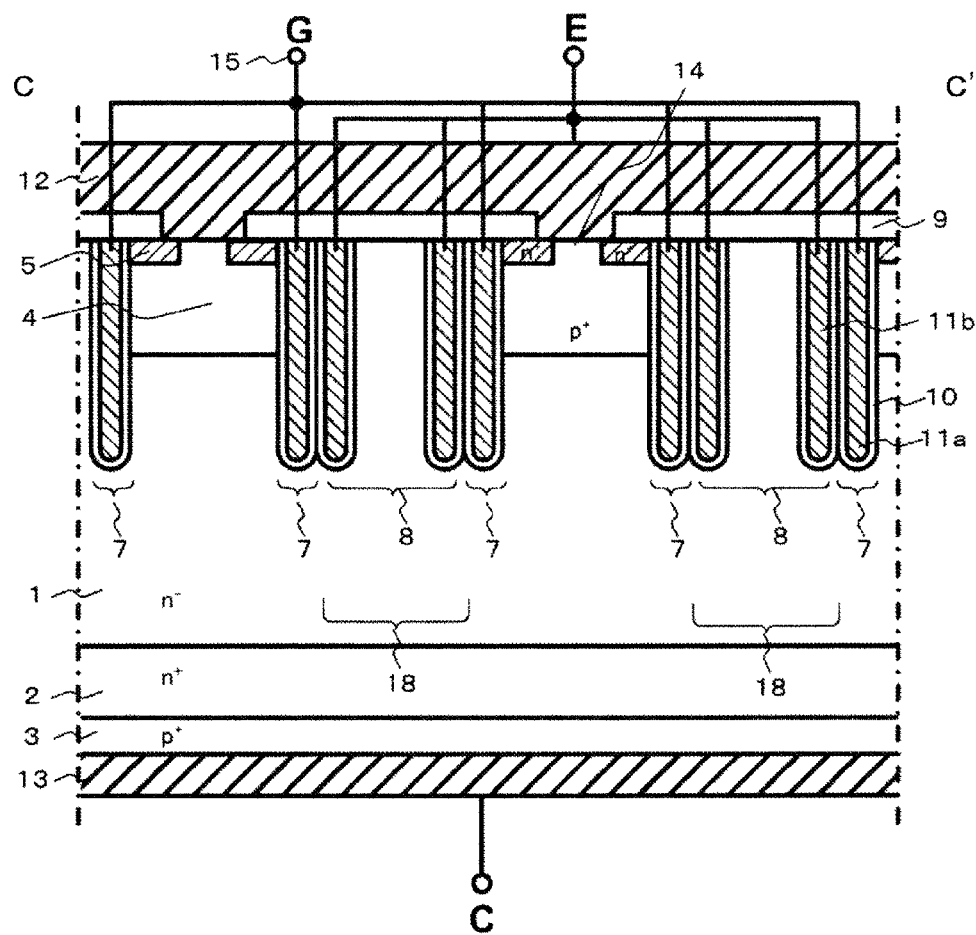
FIG. 24 is the cross sectional view along the cutting-plane line C-C' in FIG. 23.

Now a semiconductor device according to an eighth embodiment of the invention will be described with reference to FIG. 23. FIG. 23 is the oblique view of the semiconductor device according to the eighth embodiment. FIG. 24 is the cross sectional view along the cutting-plane line C-C' of FIG. 23. The semiconductor device according to the eighth embodiment is different from the semiconductor device according to the second embodiment in that gate trench 7 and dummy trench 8 are in contact with each other or in close proximity to each other in mesa region 18. It is preferable to set dummy polysilicon 11b and the emitter electrode at the same potential as described in FIG. 24. It means that if gate trench 7 and dummy trench 8 are in close proximity to each other, the width of mesa region 18 between gate trench 7 and dummy trench 8 will be almost close, for example, to the width of gate oxide film 10 (e.g. around 0.1 μm). Alternatively, when gate oxide film 10 is formed by thermal oxidation, the distance between gate trench 7 and dummy trench 8 is narrowed by the pileup of thermal oxidation such that the distance between gate trench 7 and dummy trench 8 is shorter than the thermal oxidation film thickness.

Here, the pileup implies that when a thermal silicon oxide film of a certain thickness is formed, about 44% of silicon in the thermal oxide film thickness is consumed by the well-known mechanism of silicon thermal oxidation. If gate oxide films 10 in gate trench 7 and dummy trench 8 stick to each other by pileup, gate oxide films 10 will be in contact with each other. In this case, if gate polysilicon 11a and dummy polysilicon 11b are made not to short-circuit to each other, the Miller capacitance will be reduced more. In other words, it is possible for a small voltage component of the equipotential surface in mesa region 18 to extend between gate polysilicon 11a and dummy polysilicon 11b in the zero-bias state (in the thermal equilibrium state) or at the collector-emitter voltage $V_{CE}$ of around 10 V. This is because gate polysilicon 11a and dummy polysilicon 11b in dummy trench 8 adjacent to (in close proximity to) gate trench 7 are close to each other sufficiently. Further, the equipotential surface does not almost extend through the mesa region 18 between adjacent dummy trenches 8. Therefore, the equipotential surface is almost flat in the zero-bias state, and the area thereof is the minimum. Therefore, the Miller capacitance becomes sufficiently small.

As described above, the semiconductor device according to the eighth embodiment exhibits the effects, the same with the effects, which the semiconductor devices according to the first and second embodiments exhibit.

Ninth Embodiment

Figure 25:
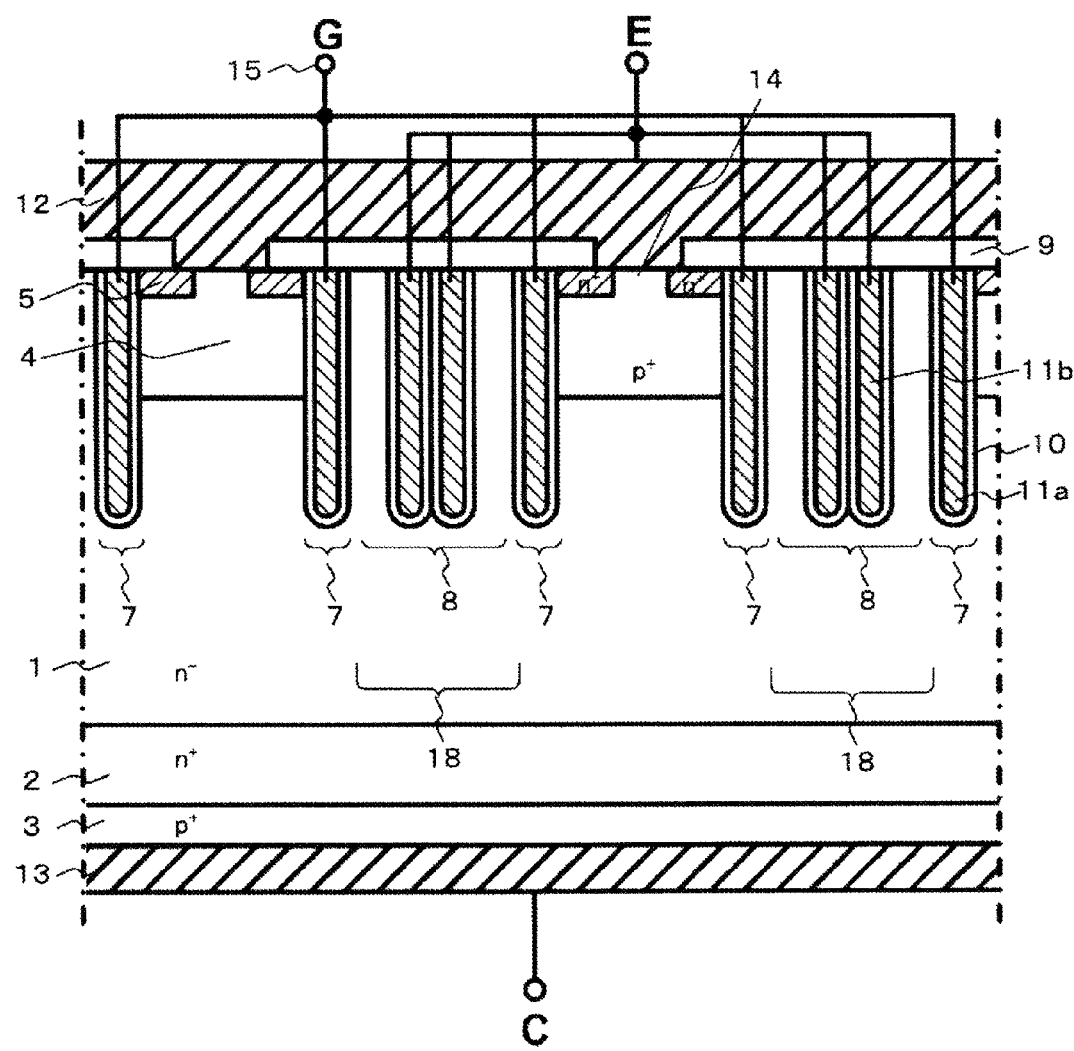
FIG. 25 is the cross sectional view of a semiconductor device according to a ninth embodiment of the invention.

Now a semiconductor device according to a ninth embodiment of the invention will be described with reference to FIG. 25. FIG. 25 is the cross sectional view of the semiconductor device according to the ninth embodiment. The semiconductor device according to the ninth embodiment is different from the semiconductor device according to the eighth embodiment in that two dummy trenches 8 are in contact with each other or in close proximity to each other sufficiently in the semiconductor device according to the ninth embodiment. Two dummy trenches 8 are spaced apart from adjacent gate trenches 7. By the arrangement, gate polysilicon 11a and dummy polysilicon 11b are prevented from causing short-circuiting with each other and the Miller capacitance is reduced. The number of dummy trenches 8 is not limited to two and three or more dummy trenches 8 may be employed. It is preferable to connect dummy polysilicon 11b to emitter electrode 12, since the Miller capacitance is reduced as described above.

As described above, the semiconductor device according to the ninth embodiment exhibits the effects, the same with the effects, which the semiconductor devices according to the first and eighth embodiments exhibit.

Tenth Embodiment

Figure 27:
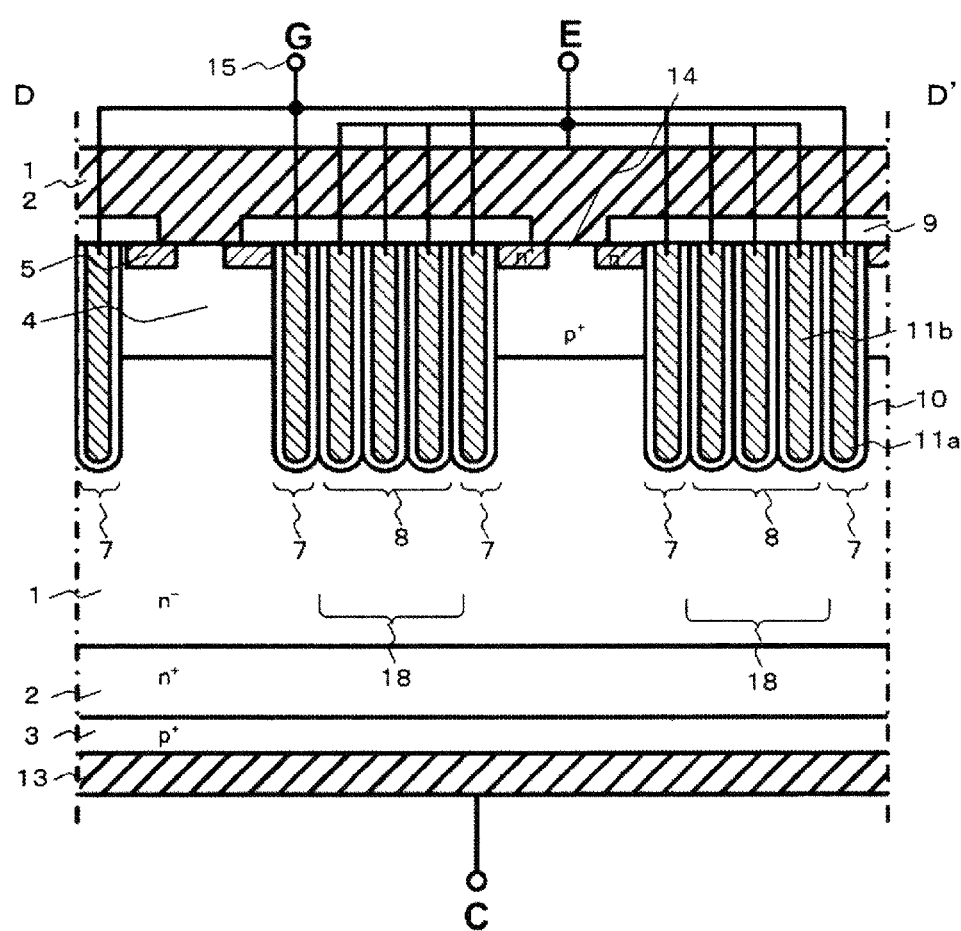
FIG. 27 is the cross sectional view along the cutting-plane line D-D' in FIG. 26.

Now a semiconductor device according to a tenth embodiment of the invention will be described with reference to FIGS. 26 and 27. FIG. 26 is the oblique view of the semiconductor device according to the tenth embodiment. FIG. 27 is the cross sectional view along the cutting-plane line D-D' in FIG. 26. The specific feature of the semiconductor device according to the tenth embodiment is described below. Between all the p-type base layers 4 adjacent to each other in the extending direction of gate trench 7 in mesa region 18 sandwiched by gate trenches 7, dummy trenches 8 are formed. Adjacent gate trench 7 and dummy trench 8 are in contact with each other or in close proximity to each other and adjacent dummy trenches 8 are in contact with each other or in close proximity to each other. The other structures are the same with those according to the first embodiment.

In the structures described above, many equipotential surfaces are not in mesa region 18 but formed below the bottoms of dummy trench 8 and gate trench 7. As a result, the Miller capacitance is made to be sufficiently small. If dummy polysilicon 11b is connected to emitter electrode 12 and set at the emitter electrode 12 potential as shown in FIG. 27, the equipotential surfaces will hardly be in mesa region 18 anymore and, more preferably, an IGBT that exhibits very low Miller capacitance Cgc will be obtained.

As described above, the semiconductor device according to the tenth embodiment exhibits the effects, the same with the effects, which the semiconductor device according to the first embodiment exhibits.

Eleventh Embodiment

Figure 28:
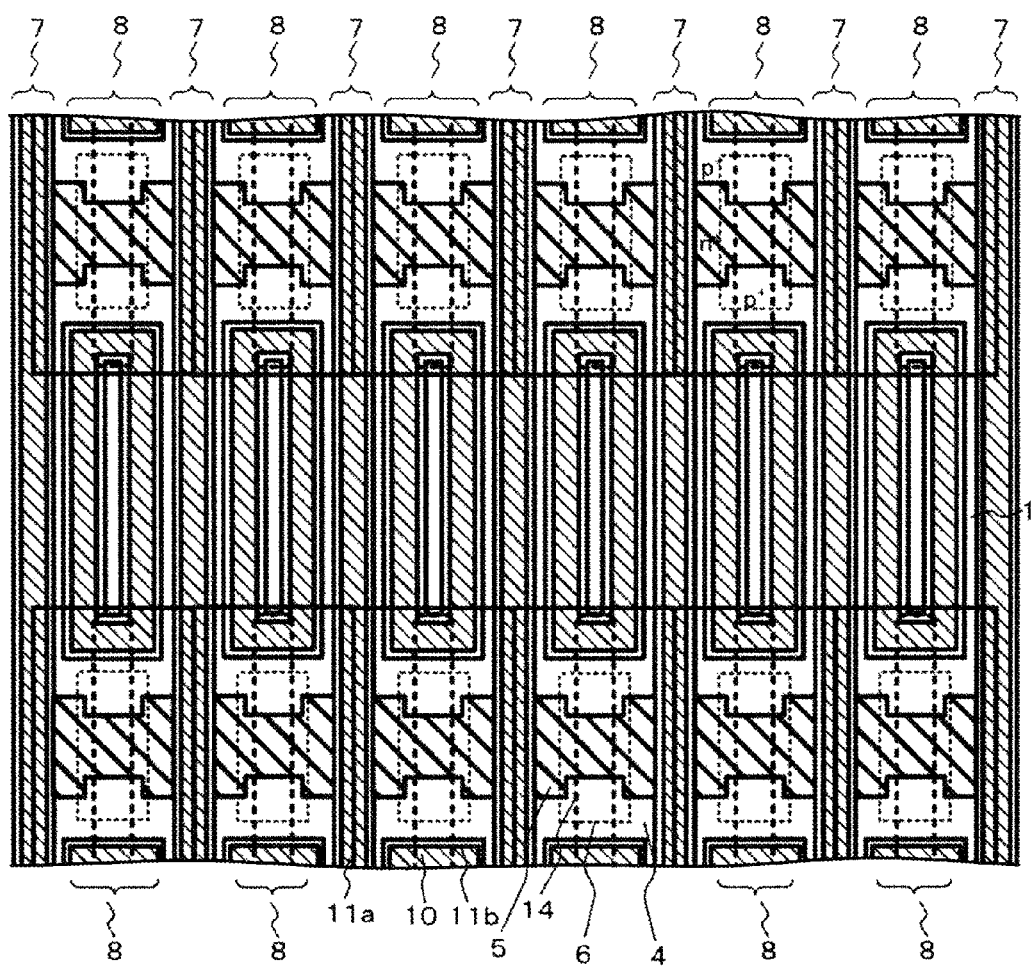
FIG. 28 is the top plan view of a semiconductor device according to an eleventh embodiment of the invention.

Now a semiconductor device according to an eleventh embodiment of the invention will be described with reference to FIG. 28. FIG. 28 is the top plan view of the semiconductor device according to the eleventh embodiment. The specific feature of the semiconductor device according to the eleventh embodiment is that p-type base layers 4 are arranged not in a checkered planar pattern but aligned in perpendicular to the extending direction of gate trench 7. The other structures are the same with those according to the first embodiment. By arranging p-type base layers 4 as described above, the Miller capacitance is reduced.

If p-type base layers 4 are arranged in a checkered pattern, two p-type base layers 4 in contact with mesa region 18 via gate trench 7 will sandwich mesa region 18. Therefore, the pinch-off effect of the depletion layers in mesa region 18 is further enhanced. If p-type base layers 4 are arranged in a checkered pattern, it is possible to distribute the current density in the upper chip surface in the ON-state of the IGBT uniformly. Therefore, it is more preferable for p-type base layer 4 to distribute in a checkered pattern.

As described above, the semiconductor device according to the eleventh embodiment exhibits the effects, the same with the effects, which the semiconductor device according to the first embodiment exhibits.

The embodiments of the invention are not limited to those described above. It is possible to change the lengths of the gate trench and the dummy trench in the extending direction thereof, the lengths of the gate trench and the dummy trench in the direction perpendicular to the extending direction thereof, and such sizes of the regions which constitute the IGBT appropriately.

INDUSTRIAL APPLICABILITY

As described above, the semiconductor devices according to the invention are useful for a power semiconductor device such as in insulated-gate semiconductor device (IGBT) used in electric power converters.

DESCRIPTIONS OF THE REFERENCE NUMERALS

1: n-type drift layer
2: n-type field-stop layer
3: p-type collector layer
4: p-type base layer
5: n-type emitter layer
6: p-type contact layer
7: Gate trench
8: Dummy trench
9: Interlayer insulator film
10: Gate oxide film
11a: Gate polysilicon
11b: Dummy polysilicon
12: Emitter electrode
13: Collector electrode
14: Contact opening
15: Gate electrode
16: Depletion layer edge
17: Polysilicon pad
18: Mesa region
19: pn-junction
20: DC power supply
21: Capacitor
22: Power supply for gate driving
23: Gate resistance
24: IGBT
25: FWD
26: Inductive load
27: Floating inductance
28: Middle portion
29: Bridge portion
30: Floating p-type layer

What is claimed is:

1. A semiconductor device comprising:
a first semiconductor layer of a first conductivity type;
a second semiconductor layer of a second conductivity type formed above the first semiconductor layer;
a first trench formed in a surface of the second semiconductor layer, the first trench being shaped with a stripe;
a gate electrode formed in the first trench with an insulator film (10) interposed between the gate electrode and the first trench;
a third semiconductor layer of the first conductivity type formed selectively between the first trenches in an extending direction of the first trenches;
a fourth semiconductor layer of the second conductivity type formed selectively in a surface of the third semiconductor layer;
an emitter electrode in contact with the third semiconductor layer and the fourth semiconductor layer;
a collector electrode in contact with the first semiconductor layer;
a second trench formed between the first trenches adjacent to each other, the second trench being formed in parallel to the first trenches adjacent to each other, and the second trench being formed between two of the third semiconductor layers; and
a mesa region exposed in a surface of the second semiconductor layer and arranged along the longitudinal direction of the trenches,
the mesa region being sandwiched by the second semiconductor layer and the first and second trenches, and contacting the emitter electrode via the third semiconductor layer, such that the third semiconductor layer and the second semiconductor layer are exposed alternately in the surface.

2. The semiconductor device according to claim 1, the semiconductor device further comprising a first electrical conductor buried in the second trench with an insulator film interposed between the first electrical conductor and the second trench, the first electrical conductor being spaced apart from the gate electrode.

3. The semiconductor device according to claim 2, wherein the first electrical conductor is connected to the emitter electrode.

4. The semiconductor device according to claim 3, wherein the first electrical conductor is connected to the emitter electrode in a distal end portion of the second trench in an extending direction of the second trench.

5. The semiconductor device according to claim 2, wherein two or more of the second trenches are formed between the first trenches adjacent to each other.

6. The semiconductor device according to claim 5, wherein the first electrical conductors formed in two or more of the second trenches are connected electrically to each other for setting the first electrical conductors at a same potential.

7. The semiconductor device according to claim 6, wherein the second trenches adjacent to each other are connected to each other in distal end portions of the second trenches in an extending direction of the second trenches, and
the first electrical conductors formed in the second trenches are connected to each other in the distal end portions.

8. The semiconductor device according to claim 6, the semiconductor device further comprising a second electrical conductor on upper surfaces of the second trenches adjacent to each other, the second electrical conductor being in contact with the first electrical conductors for connecting the first electrical conductors in the second trenches to each other, and
the second electrical conductor being connected to the emitter electrode in a part of the second electrical conductor.

9. The semiconductor device according to claim 2, wherein the first electrical conductor is separated from the emitter electrode, the collector electrode, and the gate electrode for setting the first electrical conductor at a floating potential.

10. The semiconductor device according to any of claim 1, wherein the first trench and the second trench are in contact with each other on a side wall of the first trench along the extending direction of the first trench or on a side wall of the second trench along an extending direction of the second trench.

11. The semiconductor device according to claim 1, wherein a distance between the first trench and the second trench is shorter than a width of a built-in depletion layer that expands, in a thermal equilibrium state, into the second semiconductor layer from a pn-junction between the second semiconductor layer and the third semiconductor layer.

12. The semiconductor device according to claim 2, wherein a distance between the first trench and the second trench is shorter than a width of a built-in depletion layer that expands, in a thermal equilibrium state, into the second semiconductor layer from a pn-junction between the second semiconductor layer and the third semiconductor layer.

13. The semiconductor device according to claim 3, wherein a distance between the first trench and the second trench is shorter than a width of a built-in depletion layer that expands, in a thermal equilibrium state, into the second semiconductor layer from a pn-junction between the second semiconductor layer and the third semiconductor layer.

14. The semiconductor device according to claim 4, wherein a distance between the first trench and the second trench is shorter than a width of a built-in depletion layer that expands, in a thermal equilibrium state, into the second semiconductor layer from a pn-junction between the second semiconductor layer and the third semiconductor layer.

15. The semiconductor device according to claim 5, wherein a distance between the first trench and the second trench is shorter than a width of a built-in depletion layer that expands, in a thermal equilibrium state, into the second semiconductor layer from a pn-junction between the second semiconductor layer and the third semiconductor layer.

16. The semiconductor device according to claim 6, wherein a distance between the first trench and the second trench is shorter than a width of a built-in depletion layer that expands, in a thermal equilibrium state, into the second semiconductor layer from a pn-junction between the second semiconductor layer and the third semiconductor layer.

17. The semiconductor device according to claim 7, wherein a distance between the first trench and the second trench is shorter than a width of a built-in depletion layer that expands, in a thermal equilibrium state, into the second semiconductor layer from a pn-junction between the second semiconductor layer and the third semiconductor layer.

18. The semiconductor device according to claim 8, wherein a distance between the first trench and the second trench is shorter than a width of a built-in depletion layer that expands, in a thermal equilibrium state, into the second semiconductor layer from a pn-junction between the second semiconductor layer and the third semiconductor layer.

19. The semiconductor device according to claim 9, wherein a distance between the first trench and the second trench is shorter than a width of a built-in depletion layer that expands, in a thermal equilibrium state, into the second semiconductor layer from a pn-junction between the second semiconductor layer and the third semiconductor layer.

20. The semiconductor device according to claim 10, wherein a distance between the first trench and the second trench is shorter than a width of a built-in depletion layer that expands, in a thermal equilibrium state, into the second semiconductor layer from a pn-junction between the second semiconductor layer and the third semiconductor layer.

* * * * *